(12) United States Patent
Johnson et al.

(10) Patent No.: US 12,021,349 B2
(45) Date of Patent: Jun. 25, 2024

(54) EYE SAFE OPTICAL MODULES

(71) Applicant: Vixar, Inc., Plymouth, MN (US)

(72) Inventors: Klein L. Johnson, Orono, MN (US);
David Sandquist, St. Paul, MN (US);
Mary K. Hibbs-Brenner, Plymouth, MN (US)

(73) Assignee: Vixar, Inc., Plymouth, MN (US)

( * ) Notice: Subject to any disclaimer, the term of this patent is extended or adjusted under 35 U.S.C. 154(b) by 0 days.

(21) Appl. No.: 16/359,879

(22) Filed: Mar. 20, 2019

(65) Prior Publication Data

US 2019/0296522 A1    Sep. 26, 2019

Related U.S. Application Data

(60) Provisional application No. 62/645,316, filed on Mar. 20, 2018.

(51) Int. Cl.
*H01S 5/0683* (2006.01)
*H01S 5/02253* (2021.01)
(Continued)

(52) U.S. Cl.
CPC ........ *H01S 5/0683* (2013.01); *H01S 5/02253* (2021.01); *H01S 5/02257* (2021.01);
(Continued)

(58) Field of Classification Search
CPC ..... H04B 2210/08; H01S 5/0683–0687; H01S 5/02288; H01S 5/02296;
(Continued)

(56) References Cited

U.S. PATENT DOCUMENTS 5,309,461 A * 5/1994 Call ................. G11B 7/126
5,663,944 A * 9/1997 Mun ................ G11B 7/1353
372/98

(Continued)

FOREIGN PATENT DOCUMENTS

EP    0 786 836 A2    7/1997
JP    2003 060299 A    2/2003
(Continued)

OTHER PUBLICATIONS

Invitation to Pay Additional Fees for related International Application No. PCT/US2018/063020 dated Jan. 18, 2019; 2 pages.
(Continued)

*Primary Examiner* — Sean P Hagan
(74) *Attorney, Agent, or Firm* — Viering, Jentschura & Partner mbB

(57) ABSTRACT

The present disclosure relates to a packaging approach for ensuring that high power optical modules incorporating VCSELs and VCSEL arrays remain eye safe. A VCSEL device or VCSEL package of the present disclosure may generally be configured certifying an optical device as eye safe such that the device is able to survive a single failure mode. In other embodiments, a multiple lens array is arranged above the VCSEL, which scatters the light into a wide range of angles such that a higher percentage of light will reach the photodetector located beside the VCSEL. In other embodiments according to the present disclosure, one or more methods and circuits are provided to detect and correct errors or failures caused by one or more unsafe conditions.

9 Claims, 27 Drawing Sheets

(51) Int. Cl.
  *H01S 5/02257* (2021.01)
  *H01S 5/02326* (2021.01)
  *H01S 5/026* (2006.01)
  *H01S 5/183* (2006.01)

(52) U.S. Cl.
  CPC ........ *H01S 5/02326* (2021.01); *H01S 5/0264* (2013.01); *H01S 5/183* (2013.01)

(58) Field of Classification Search
  CPC .... H01S 5/02248–02252; H01S 5/0262–0264; H01S 5/183–18397; H01S 5/02253; H01S 5/02208–02216; H01S 5/0225; H01S 5/02257; H01S 5/06825–0687; H01S 5/42–423
  See application file for complete search history.

(56) References Cited

U.S. PATENT DOCUMENTS

| | | | |
|---|---|---|---|
| 5,732,101 A | 3/1998 | Shin | |
| 5,752,100 A * | 5/1998 | Schrock | G02B 7/32 361/103 |
| 5,761,229 A * | 6/1998 | Baldwin | H01S 5/02253 372/32 |
| 5,771,254 A | 6/1998 | Baldwin | |
| 5,835,514 A | 11/1998 | Yuena et al. | |
| 5,943,357 A | 8/1999 | Lebby et al. | |
| 5,997,185 A * | 12/1999 | Kropp | G02B 6/4214 385/89 |
| 6,111,903 A * | 8/2000 | Isaksson | G11B 7/126 372/50.21 |
| 6,188,498 B1 | 2/2001 | Link et al. | |
| 6,368,890 B1 | 4/2002 | Wickström et al. | |
| 6,867,929 B2 | 3/2005 | Lopez-Hernandez et al. | |
| 7,529,284 B2 | 5/2009 | Karnutsch | |
| RE41,738 E | 9/2010 | Brenner et al. | |
| 8,249,121 B2 | 8/2012 | Brenner et al. | |
| 8,494,018 B2 | 7/2013 | Brenner et al. | |
| 8,660,161 B2 | 2/2014 | Brenner et al. | |
| 8,989,230 B2 | 3/2015 | Dummer et al. | |
| 9,088,134 B2 | 7/2015 | Hibbs-Brenner et al. | |
| 9,748,737 B2 | 8/2017 | Takiguchi et al. | |
| 2002/0163688 A1 | 11/2002 | Zhu | |
| 2003/0026303 A1* | 2/2003 | Ouchi | H01S 5/423 372/50.1 |
| 2003/0053222 A1 | 3/2003 | Togani et al. | |
| 2004/0004985 A1 | 1/2004 | Zhu | |
| 2004/0170014 A1 | 9/2004 | Pritchard et al. | |
| 2004/0264537 A1 | 12/2004 | Jackson | |
| 2005/0041715 A1 | 2/2005 | Kim | |
| 2006/0180667 A1 | 8/2006 | Sanchez-Olea | |
| 2006/0232900 A1 | 10/2006 | Takeuchi | |
| 2008/0043793 A1 | 2/2008 | Ueki et al. | |
| 2008/0247436 A1* | 10/2008 | Carter | H01S 5/0264 372/50.11 |
| 2010/0193805 A1 | 8/2010 | Jogan | |
| 2011/0273900 A1 | 11/2011 | Li et al. | |
| 2012/0025714 A1 | 2/2012 | Downing, Jr. et al. | |
| 2012/0140109 A1* | 6/2012 | Shpunt | G03B 21/14 348/345 |
| 2012/0293625 A1* | 11/2012 | Schneider | F16P 3/142 348/46 |
| 2013/0272329 A1 | 10/2013 | Auen et al. | |
| 2013/0334559 A1 | 12/2013 | Vdovin et al. | |
| 2014/0139467 A1 | 5/2014 | Ghosh et al. | |
| 2014/0160751 A1 | 6/2014 | Hogan et al. | |
| 2015/0034975 A1 | 2/2015 | Rudmann et al. | |
| 2015/0063396 A1 | 3/2015 | Jikutani et al. | |
| 2015/0229912 A1 | 8/2015 | Masalkar et al. | |
| 2015/0380901 A1 | 12/2015 | Brenner et al. | |
| 2016/0352071 A1 | 12/2016 | Hogan et al. | |
| 2016/0352074 A1 | 12/2016 | Hogan et al. | |
| 2017/0267175 A1 | 9/2017 | Ichikawa | |
| 2017/0350581 A1* | 12/2017 | Balimann | H01S 5/02296 |
| 2017/0353004 A1 | 12/2017 | Chen et al. | |
| 2017/0370554 A1 | 12/2017 | Mackinnon et al. | |
| 2018/0104506 A1 | 4/2018 | Kurtz et al. | |
| 2018/0309967 A1 | 10/2018 | Wang | |
| 2018/0342853 A1* | 11/2018 | Balslev | H01S 5/02257 |
| 2019/0296522 A1 | 9/2019 | Johnson et al. | |
| 2019/0331473 A1 | 10/2019 | Johnson | |
| 2020/0052466 A1 | 2/2020 | Chen et al. | |
| 2020/0067264 A1 | 2/2020 | Guo et al. | |
| 2020/0274320 A1 | 8/2020 | Inada et al. | |
| 2020/0285723 A1 | 9/2020 | Ono et al. | |

FOREIGN PATENT DOCUMENTS

| | | |
|---|---|---|
| WO | 2008/135093 A2 | 11/2008 |
| WO | 2016/198282 A1 | 12/2016 |

OTHER PUBLICATIONS

International Search Report for related International Application No. PCT/US2018/063020 dated Apr. 11, 2019; 4 pages.
Written Opinion for related International Application No. PCT/US2018/063020 dated Apr. 11, 2019; 6 pages.
Invitation to Pay Additional Fees for corresponding International Application No. PCT/US2019/023251 dated May 28, 2019; 2 pages.
International Search Report for corresponding International Application No. PCT/US2019/023251 dated Jul. 25, 2019; 4 pages.
Written Opinion for corresponding International Application No. PCT/US2019/023251 dated Jul. 25, 2019; 7 pages.
Supplementary European Search Report for EP 19 77 0873; dated Dec. 9, 2021; 14 pages.
European Search Report, dated Jul. 16, 2021, 12 pages.
Extended European Search Report, dated Oct. 20, 11 pages.
USPTO. Final Office Action dated Nov. 9, 2022, , for related U.S. Appl. No. 16/204,156.

* cited by examiner

EYE SAFE OPTICAL MODULES

CROSS-REFERENCE TO RELATED APPLICATIONS

The present disclosure claims priority to U.S. Provisional Application No. 62/647,406, entitled Eye Safe Optical Modules, and filed Mar. 20, 2018, the content of which is hereby incorporated by reference herein in its entirety.

FIELD OF THE INVENTION

The present disclosure relates to optical devices such as LEDs, RCLEDs (resonant cavity LEDs), vertical-cavity surface-emitting lasers (VCSELs), and VCSEL arrays, and their packaging. Particularly, the present disclosure relates to a packaging approach for ensuring that high power optical modules incorporating these devices remain eye-safe.

BACKGROUND OF THE INVENTION

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

VCSELs and VCSEL arrays are important technology for applications within a variety of markets, including but not limited to, the consumer, industrial, automotive, and medical industries. Example applications include, but are not limited to, illumination for security cameras, illumination for sensors such as three-dimensional (3D) cameras or gesture recognition systems, medical imaging systems, light therapy systems, or medical sensing systems such as those requiring deep penetration into tissue. In such optical sensing and illumination applications as well as other applications, VCSELs and VCSEL arrays offer several benefits, as will be described in further detail herein, including but not limited to, power efficiency, narrow spectral width, narrow beam divergence, and significant packaging flexibility.

Indeed, for VCSELs and VCSEL arrays, power conversion efficiency (PCE) of greater than 30% can be achieved at wavelengths in the 660-1000 nm range. PCE may be defined as the ratio of optical power emitted from a laser(s), such as a VCSEL or VCSEL array, divided by the electrical power used to drive the laser(s). While VCSEL PCE, alone is comparable to that for some of the most efficient light-emitting diodes (LEDs) currently available, when spectral width and beam divergence are considered, there are significant efficiency benefits to VCSELs over LEDs.

For example, VCSEL arrays generally have a spectral width of approximately 1 nm. This allows the use of filters for a photodetector or camera to reduce the noise associated with background radiation. For comparison, an LED typically has a spectral linewidth of 20-50 nm, resulting in the rejection of much of the light by such a filter, and hence reducing the effective PCE of the LED. In addition, the wavelength of a VCSEL is less sensitive to temperature, increasing only around 0.06 nm per 1° Celsius increase in temperature. The VCSEL rate of wavelength shift with temperature is four times less than in a LED.

In addition, the angular beam divergence of a VCSEL is typically 10-30 degrees full width half maximum (FWHM) whereas the output beam of an LED is Lambertian, filling the full hemisphere. This means that generally all, if not all, of the light of a VCSEL can be collected using various optical elements, such as lenses for a collimated or focused beam profile, diffusers for a wide beam (40-90 degrees or more) profile, or a diffractive optical element to generate a pattern of spots or lines. Due to the wide beam angle of a LED, it can be difficult to collect all or nearly all of the light (leading to further degradation of the effective PCE), and also difficult to direct the light as precisely as is possible with a VCSEL.

The vertically emitting nature of a VCSEL also gives it much more packaging flexibility than a conventional laser, and opens the door to the use of the wide range of packages available for LEDs or semiconductor integrated circuits (ICs). In addition to integrating multiple VCSELs on the same chip, one can package VCSELs or VCSEL arrays with photodetectors or optical elements. Plastic or ceramic surface mount packaging or chip-on-board options are also available to the VCSEL.

The amount of power emitted from a single VCSEL aperture can range from microwatts to tens of milliwatts, while VCSEL arrays are used to produce powers in the range of hundreds of milliwatts to watts, or even to kilowatts. Higher power VCSEL arrays may be preferred for sensors operating over a longer distance, such as 3D sensors based upon Time of Flight or structured lighting approaches. Higher power might also be required for deeper penetration into tissue for medical sensors or diagnostic devices, or therapeutic lasers. Higher power could also be required for chemical or environmental sensors.

Particularly for a higher power VCSEL die consisting of larger VCSELs or VCSEL arrays, it would be beneficial to be able to monitor the output power of the VCSEL die. The output power of an optical device can be affected by temperature, or perhaps by aging. In many applications it is desired to maintain sufficient output power from the VCSEL die to achieve a good signal, or high signal to noise ratio. On the other hand, the VCSEL is often operated in environments to which human beings have access and one must ensure that people are not exposed to emission levels which can cause damage to the eye or skin. These requirements place both a lower and an upper limit on the optical output power, and it is desirable to have a mechanism for ensuring the power remains within this power range over a temperature range and period of time.

In addition to controlling the variations of power as a function of temperature, or changing performance versus time, certifying an optical device as eye safe requires that the device be able to survive a single failure mode. For example, many high power VCSEL arrays are being applied to consumer devices. The VCSEL array is not intrinsically eye safe, but may be made so by pulsing the device with a low duty cycle, and/or adding a diffuser above the VCSEL which expands the beam to a large angle, therefore limiting the amount of light that could enter the eye. However, failure mechanisms could include dislodging of the diffuser from the package, the condensation of liquid on the diffuser surface, which could eliminate the diffuser effect and make the diffuser transparent and ineffective, melt of the diffuser surface, or cause a failure of the electronics that would result in the VCSEL being on continuously, rather than pulsed.

More specific details regarding VCSEL structure and fabrication as well as additional VCSEL embodiments and methods for making and using VCSELs are disclosed, for example, in: U.S. Pat. No. 8,249,121, titled "Push-Pull Modulated Coupled Vertical-Cavity Surface-Emitting Lasers and Method;" U.S. Pat. No. 8,494,018, titled "Direct Modulated Modified Vertical-Cavity Surface-Emitting Lasers and Method;" U.S. Pat. No. 8,660,161, titled "Push-Pull Modulated Coupled Vertical-Cavity Surface-Emitting Lasers and Method;" U.S. Pat. No. 8,989,230, titled "Method and Apparatus Including Movable-Mirror MEMS-Tuned Surface-Emitting Lasers;" U.S. Pat. No. 9,088,134, titled "Method and Apparatus Including Improved Vertical-Cavity Surface-Emitting Lasers;" U.S. Reissue Pat. No. RE41,738, titled "Red Light Laser;" and U.S. Publ. No. 2015/0380901, titled "Method and Apparatus Including Improved Vertical-Cavity Surface-Emitting Lasers;" of which the contents of each are hereby incorporated by reference herein in their entirety. Without being limited to solely the VCSELs described in any one of the foregoing patents or patent applications, VCSELs suitable for various embodiments of the present disclosure or suitably modifiable according to the present disclosure include the VCSELs disclosed in the foregoing patents or patent applications, including any discussion of prior art VCSELs therein, as well as VCSELs disclosed in any of the prior art references cited during examination of any of the foregoing patents or patent applications. More generally, unless specifically or expressly described otherwise, any VCSEL now known or later developed may be suitable for various embodiments of the present disclosure or suitably modifiable according to the present disclosure.

Currently there are at least a couple of approaches for monitoring and controlling the output power of a VCSEL. Some of these approaches are also available for other optoelectronic devices such as an edge-emitting laser. One is to characterize the performance of a VCSEL over a temperature range. One can then include a thermistor or temperature sensor in the system, and use the measured temperature to adjust the current to achieve the desired output power based upon the previous characterization over temperature. This is illustrated in FIG. 1, where the output power versus current is plotted for a VCSEL array at a variety of temperatures ranging from 25° C. to 85° C. At 25-40° C., the current required to reach 2 W of output power is approximately 3 A in this illustration. As the ambient temperature increases to 70° C., the current required to reach 2 W increases to approximately 3.2 A, and at 85° C., the current required to reach 2 W is around 4 A. This information can be programmed into a lookup table, and the current adjusted based upon the temperature measured by the thermistor. A limitation of this approach is that there is variability from device to device, and may be some variability over time due to burn-in effects of the lifetime of the device. One can compensate for the device to device variability by calibrating each device individually, but this is expensive and time consuming. Variability over time is more difficult to compensate for.

A second approach is to monitor the output power directly, and adjust the drive current to the laser or LED to keep the output power within the desired range. This has been frequently done for devices packaged in TO headers and cans, particularly within the fiber optic data communication market. An example of a VCSEL packaged in a TO header and can is illustrated in FIG. 2. A stack can be created consisting of a photodiode 202 mounted on the metal TO header 204, and a VCSEL 206, which is smaller than the photodiode active area, mounted on a metal pad on the photodetector. To isolate the photodiode 202 from the header 204, it could optionally be mounted on a ceramic submount patterned with metal located between the header and the photodiode. The various VCSEL and PD contacts are wire bonded to the pins of the header or package for electrical contact. A lid or cap 208 is provided on top of the package.

In the case of the TO header 204, this is usually a tall metal can, with a window 210 in the top surface. The window 210 preferably does not have an AR coating, or has a controlled coating to determine the amount of light that will be reflected at the two surfaces of the window. Since the light beam 212 emitted from the VCSEL 206 has a non-zero angular range of divergence, some of the light 214 is reflected down at an angle. Light reflected at a sufficiently high angle will reach the area of the photodiode 202 not covered by the VCSEL chip and can be used to monitor the output power.

FIGS. 3A and 3B illustrates this approach with a view of the header from the top. FIG. 3A shows a VCSEL diode 306 sitting on top of a metal pad on the photodiode 302 which in turn sits on the header 304, and shows the wire bonds to the various anode and cathode contacts, including an LD anode 308, an MPD cathode 310, and an LD cathode and PD anode 312 of the two diodes. FIG. 3B shows the detail of one possible version of the photodiode 302 showing the pad that accommodates the VCSEL 306. Alternatively, the VCSEL 306 and the photodiode 302 can be placed side by side on the submount or header 304, and the photodiode will capture the light emitted from the VCSEL that is reflected to one side by the window. This usually increases the distance from the active emission area of the VCSEL 302 to the active part of the photodiode 302, and hence requires the height of the window above the VCSEL to be increased.

This approach has been applied effectively, but has some limitations. In order to capture sufficient light on the photodiode, the lid of the TO header and can be relatively high, which limits the compactness of the package. For instance, if the distance from the VCSEL emission area to the targeted part of the photodiode is 0.5 mm (a fairly small distance) and the VCSEL half angle is 11 degrees, the bottom side of the window should in some embodiments be about 1.28 mm above the top of the VCSEL. If the VCSEL to photodiode distance is increased to 1 mm, the height is doubled to 2.56 mm. The total package height also includes the header or submount thickness, the window thickness, and the VCSEL thickness, and hence can easily become 3-4 mm high. As VCSELs are applied in consumer electronics where miniaturization is key, this can be problematic. In addition, the beam divergence of the VCSEL can be affected by both temperature and current, and so one again needs to understand this relationship and potentially compensate for it. The precise geometry of the VCSEL placement relative to the photodiode can also be important. For higher output power arrays, good thermal heat sinking is required, and a TO can is typically not a sufficiently good heat sink to serve as a package.

One could potentially achieve the same effect using a plastic or ceramic surface mount package with a glass lid. Generally, these packages are low profile, and the lid is therefore not high enough above the surface of the VCSEL to reflect sufficient light onto the photodetector. While one can tool a taller package or attach a spacer, this is counterproductive when trying to achieve a low-profile package. Furthermore, when packaging a higher power VCSEL array which is typically a larger chip, the dimensional issues become more challenging. If one wishes to sample power from the entire array, one must move the reflective surface even higher. Alternatively, one must be satisfied with sampling only the edges of the array, but it is often observed that as temperature and current is increased, the VCSELs in the center or edge may emit more or less power, thus providing inaccurate data about the power being emitted from the array.

BRIEF SUMMARY OF THE INVENTION

The following presents a simplified summary of one or more embodiments of the present disclosure in order to provide a basic understanding of such embodiments. This summary is not an extensive overview of all contemplated embodiments, and is intended to neither identify key or critical elements of all embodiments, nor delineate the scope of any or all embodiments.

The present disclosure, in one or more embodiments, relates to a VCSEL device having a light-generating quantum well active region, a first and a second mirror layer, a metal contact layer, and a photodiode arranged between the metal contact layer and a submount. The first mirror layer may be arranged on a first side of the active region and may be configured to emit at least 50% of light generated by the active region. The second mirror layer may be arranged on a second side of the active region and may be configured to emit no more than 50% of light generated by the active region. The metal contact layer may be patterned with an opening aligned with a light emission direction of the VCSEL, the opening sized and configured to receive light emitted from the second mirror layer. Moreover, the photodiode, arranged between the metal contact layer and submount, may be configured to receive light emitted from the second mirror layer. In some embodiments, the VCSEL device may have a dielectric layer deposited in the opening of the metal contact layer. The opening of the metal contact layer may have a diameter or width of between 10 μm and 100 μm. In some embodiments, the opening may have a diameter or width of approximately 30 μm. The VCSEL device may further have a substrate layer arranged between the metal contact layer and the second mirror layer. The substrate layer may be substantially transparent in some embodiments. In other embodiments, the substrate layer may include an etched area aligned with the light emission direction of the VCSEL, the etched area having a diameter or width of between 25 μm and 100 μm. The VCSEL device may have a Fabry-Perot filter arranged between the etched area and the photodiode in some embodiments. The VCSEL may have a wavelength of not less than 870 nm, or not less than 920 nm. Moreover, the second mirror layer may include more mirror periods than the first mirror layer. In some embodiments, one of the first and second mirror layers may be dope n-type, and the other of the first and second mirror layers may be doped p-type.

The present disclosure, in one or more embodiments, additionally relates to a method of controlling output power of a VCSEL device. The method may include constructing a VCSEL device having a light-generating quantum well active region arranged between a first mirror layer and a second mirror layer. The first mirror layer may be configured to emit at least 50% of light generated by the active region, and the second mirror layer may be configured to emit no more than 50% of light generated by the active region. The method may further include depositing a metal contact layer on the second mirror layer, and patterning the metal contact layer with an opening aligned with a light emission direction of the VCSEL. The opening may be sized and configured to receive light emitted from the second mirror layer. The method may further include arranging the VCSEL device on a submount with a photodiode positioned between the metal contact layer and the submount, the photodiode configured to receive light emitted from the second mirror. Further, the method may include directing a signal received by the photodiode to a drive for the VCSEL to maintain a desired output power range. In some embodiments, the method may include depositing a dielectric layer in the opening of the metal contact layer.

The present disclosure, in one or more embodiments, additionally relates to low-profile VCSEL package having a VCSEL device and a photodiode arranged on a submount. The VCSEL package may further have a window configured and arranged to allow light emitted from the VCSEL to pass therethrough. The VCSEL package may have a spacer arranged between the submount and the window. A diffuser may additionally be arranged on at least a portion of the window. In some embodiments, the diffuser may be arranged on a portion of the window so as to be laterally offset from a central axis of the light emitted from the VCSEL device. In other embodiments, the diffuser may be arranged on the window so as to be aligned with a central axis of light emitted from the VCSEL device, and the diffuser may have a ring shape with a central opening. The VCSEL package may have an array of VCSEL devices in some embodiments. Moreover, the photodiode may be arranged on the submount adjacent the VCSEL device(s). The VCSEL package may have a thickness of less than 3 mm, or less than 2 mm in some embodiments.

The present disclosure, in one or more embodiments, additionally relates to designs and mechanisms for detecting and compensating for changes or failures that may result in the conversion of an eye safe optical device into one that is not eye safe. In some embodiments, an eye safe optical device may include a VCSEL device and a photodiode arranged on a submount. In other embodiments, the VCSEL package may include methods and systems for measuring photodiode current using one or more of a controller, microprocessor, transimpedance amplifier, comparator, ADC, or other electrical circuit or software. In other embodiments, the VCSEL package may include methods and systems for detecting and comparing actual current to expected current using a microprocessor and comparator. In still other embodiments, the VCSEL package may include methods and systems for implementing corrective actions to account for changes or failures detected by the VCSEL package. In some embodiments, corrective actions may include setting digital or analog error flags in response to the detection of error states, enabling or disabling the VCSEL package, and/or taking other corrective action in response to error detection states.

The present disclosure, in one or more embodiments, additionally relates to a VCSEL package including a window configured and arranged to allow light emitted from the VCSEL to pass therethrough. The VCSEL package may further include an array of VCSEL devices in some embodiments. In other embodiments, one or more micro lenses may be arranged on at least a portion of the window such that the light from the VCSEL device impinges upon the one or more micro lenses. The one or more micro lenses may be arranged in a random or regular array. In some embodiments, the one or more micro lenses may be arranged such that a portion of the light emitted from the VCSEL device is transferred through the micro lens, and a portion of the light is scattered laterally, thereby increasing the eye safety of the device.

While multiple embodiments are disclosed, still other embodiments of the present disclosure will become apparent to those skilled in the art from the following detailed description, which shows and describes illustrative embodiments of the invention. As will be realized, the various embodiments of the present disclosure are capable of modifications in various obvious aspects, all without departing from the spirit and scope of the present disclosure. Accordingly, the drawings and detailed description are to be regarded as illustrative in nature and not restrictive.

BRIEF DESCRIPTION OF THE DRAWINGS

While the specification concludes with claims particularly pointing out and distinctly claiming the subject matter that is regarded as forming the various embodiments of the present disclosure, it is believed that the invention will be better understood from the following description taken in conjunction with the accompanying Figures, in which:

DETAILED DESCRIPTION OF THE INVENTION

In one or more embodiments, the present disclosure relates to an approach for monitoring the output power of a VCSEL or VCSEL array in a relatively compact, low profile package. Monitoring of the VCSEL provides feedback that may allow the output power to be controlled to optimize a signal to noise level, and/or to keep the VCSEL output within eye safe limits, as examples. A VCSEL device or VCSEL package of the present disclosure may generally be configured with a photodiode for monitoring output power of one or more VCSELs. In some embodiments, one or more VCSEL devices may be arranged over or on a photodetector, such that the photodetector is configured to detect light emitted through a bottom of the VCSEL. In such embodiments, the VCSEL device may have a patterned bottom metal layer and/or an etched substrate to allow light to pass below or behind the VCSEL to the photodiode. In other embodiments, a photodetector may be arranged on a submount adjacent one or more VCSELs, and may be configured to detect light reflected via a diffuser in order to monitor output power.

Figure 4A:
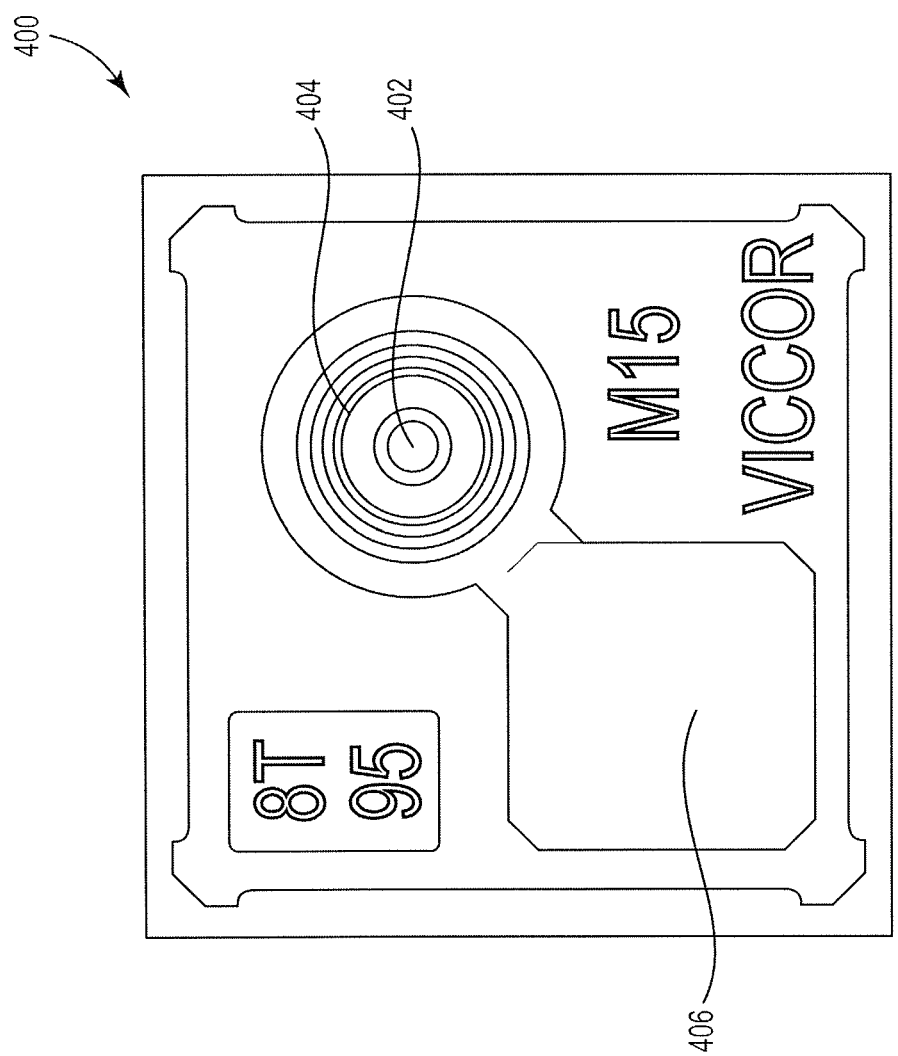
FIG. 4A is an example schematic diagram of a VCSEL die having a single VCSEL aperture, according to one or more embodiments.
Figure 4B:
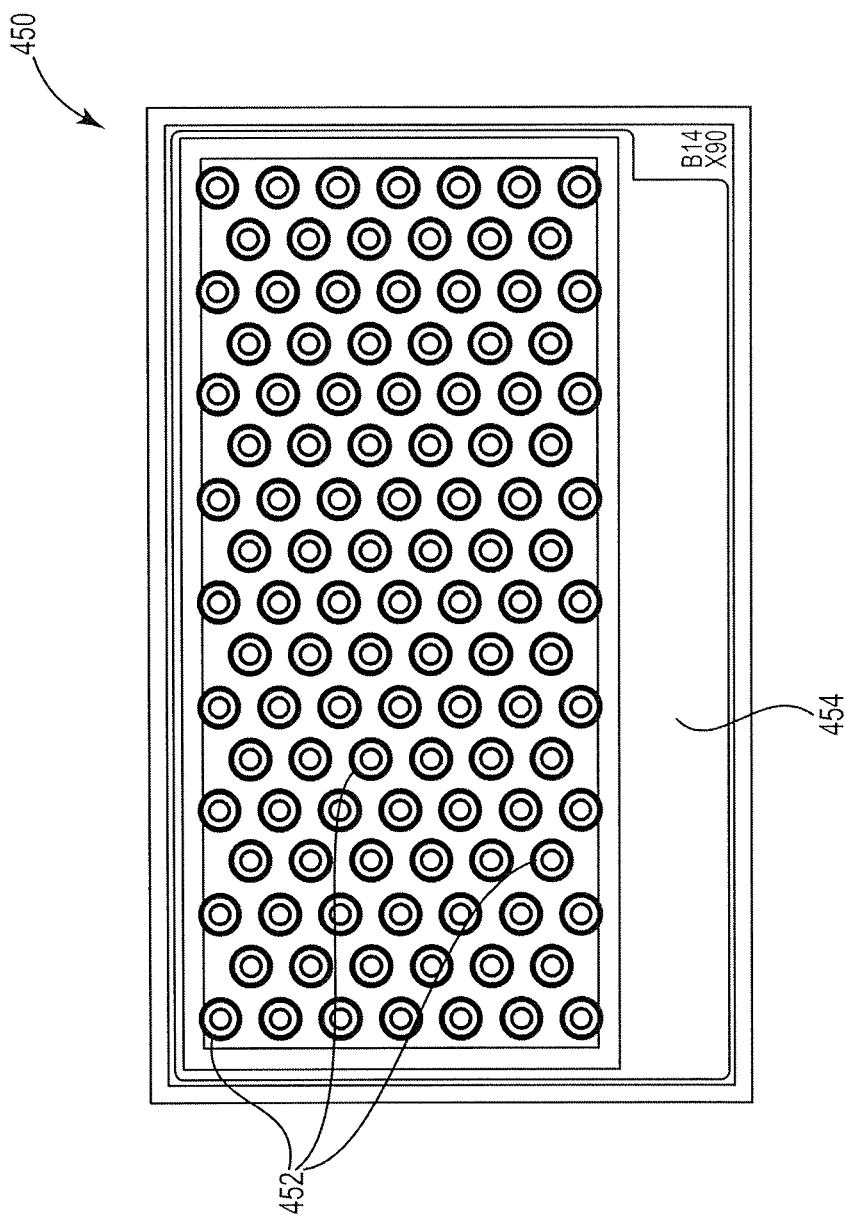
FIG. 4B is an example schematic diagram of a VCSEL array chip having a plurality of VCSEL apertures, according to one or more embodiments.

Turning now to FIGS. 4A and 4B, two VCSEL dies of the present disclosure are shown. These devices are pictured from the top surface of the VCSEL die. FIG. 4A illustrates a die 400 with a single VCSEL aperture 402, including a metal ring 404 surrounding an opening through which the light is emitted. The die 400 further includes a metal bond pad 406. FIG. 4B illustrates a VCSEL array 450 with many VCSEL apertures 452 on a chip. In this case there are 111 VCSEL apertures 452. However, a VCSEL array may have any other suitable number of apertures arranged in any suitable configuration or shape. The array 450 further includes a metal bond pad 454. With respect to FIGS. 4A and 4B, the VCSEL light is emitted from the top surface in both cases.

Figure 1:
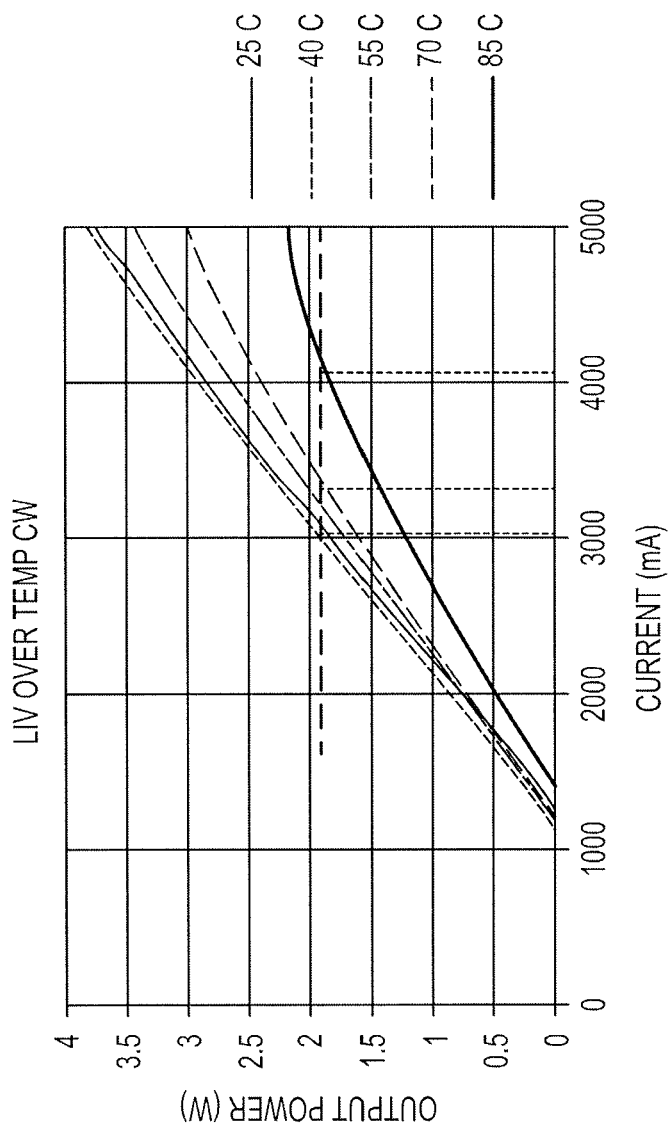
FIG. 1 is a graph illustrating output power versus current for a VCSEL array at a variety of temperatures, according to one or more embodiments.
Figure 2:
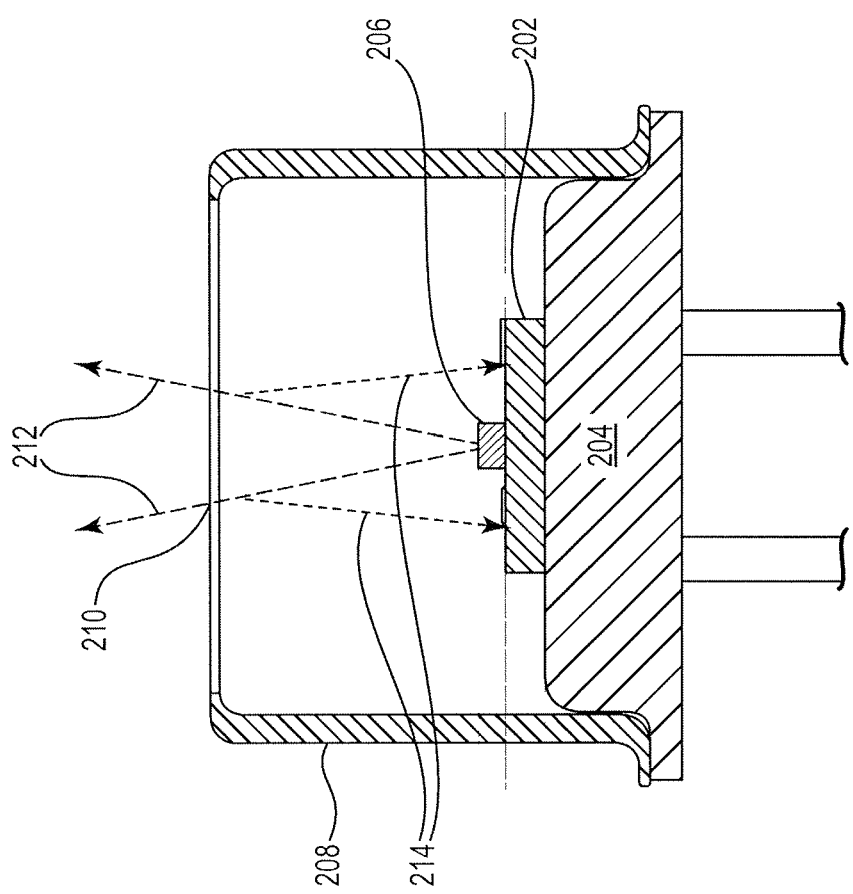
FIG. 2 is a schematic cross-sectional view of a VCSEL package having a TO header and TO header cap, according to one or more embodiments.
Figure 3B:
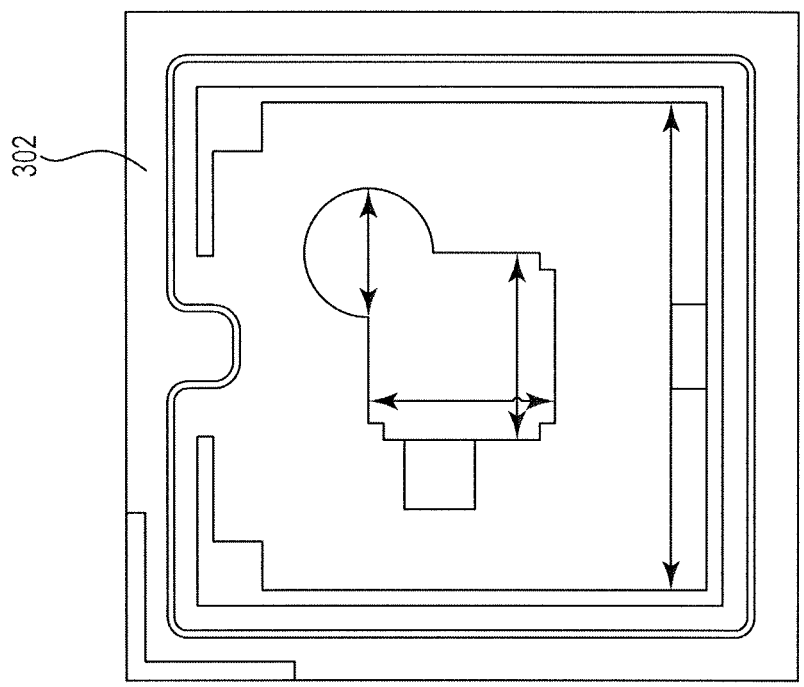
FIG. 3B is an example schematic diagram of a photodiode of the VCSEL device of FIG. 2, according to one or more embodiments.
Figure 3A:
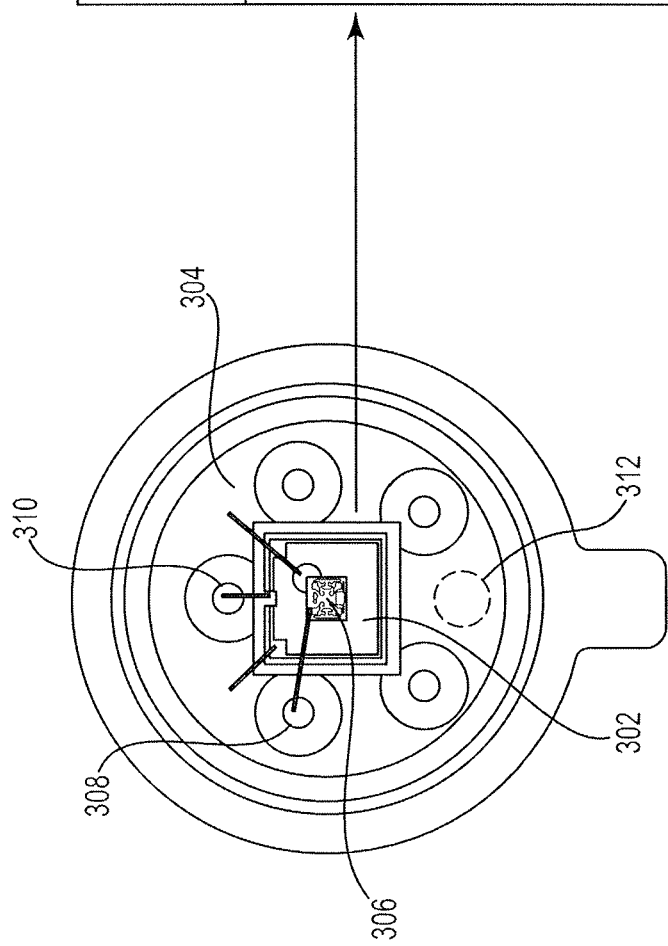
FIG. 3A is an example schematic diagram of the TO header of the VCSEL device of FIG. 2, according to one or more embodiments.
Figure 5:
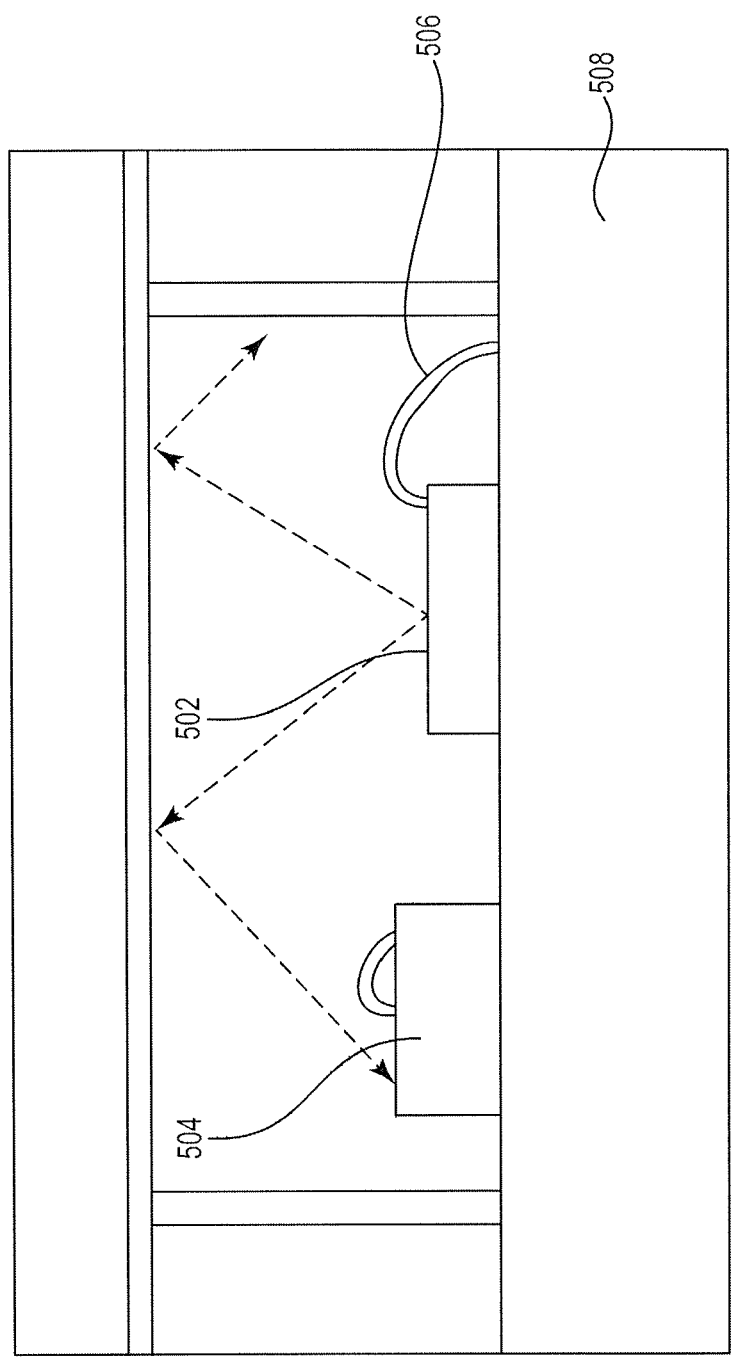
FIG. 5 is a schematic cross-sectional view of a plastic or ceramic surface mount VCSEL package, according to one or more embodiments.

One or more VCSEL dies may be mounted in a package in some embodiments. A VCSEL package may facilitate the electrical and optical interfaces to a chip. VCSELs are diodes and hence may have a contact to the anode and a contact to the cathode to operate. Since the substrate of the VCSEL is often conducting, this may be accomplished by attaching the VCSEL into the package using a conductive epoxy or solder between the VCSEL substrate and the package. The other contact can be formed by a wire bond to the metal bond pad areas on the top side of the chip. The VCSEL chip then may be enclosed to provide mechanical protection to the die and wire bonds. There also may be a transparent window to allow the optical beam to escape. For example, a VCSEL die may be arranged with a TO header and cap, such as those shown in FIG. 2. For TO headers, as shown in FIG. 2, a can may be arranged over the top of the header, with a window in the top surface of the can to allow light to pass therethrough. Other VCSEL packages may have a plastic or ceramic surface mount with walls, such that the VCSEL die sits down in a cavity. This is shown, according to at least one example, in FIG. 5, in which a VCSEL array 502 and monitor photodiode 504 are arranged on a ceramic or plastic leadframe or submount 508. Wire bonds 506 are shown as well. The chip can be encapsulated with a clear liquid which is subsequently cured to a solid or gel. Alternatively, a clear plastic or glass planar lid can be attached to the top of the package. The plastic or glass lid could also take the form of a lens or a diffuser. These packaged VCSELs are often implemented in sensors inside of other electronics, including consumer electronics. It is usually desirable to miniaturize the sensor as much as possible, and particularly to use low profile components to keep the devices thin.

Figure 6:
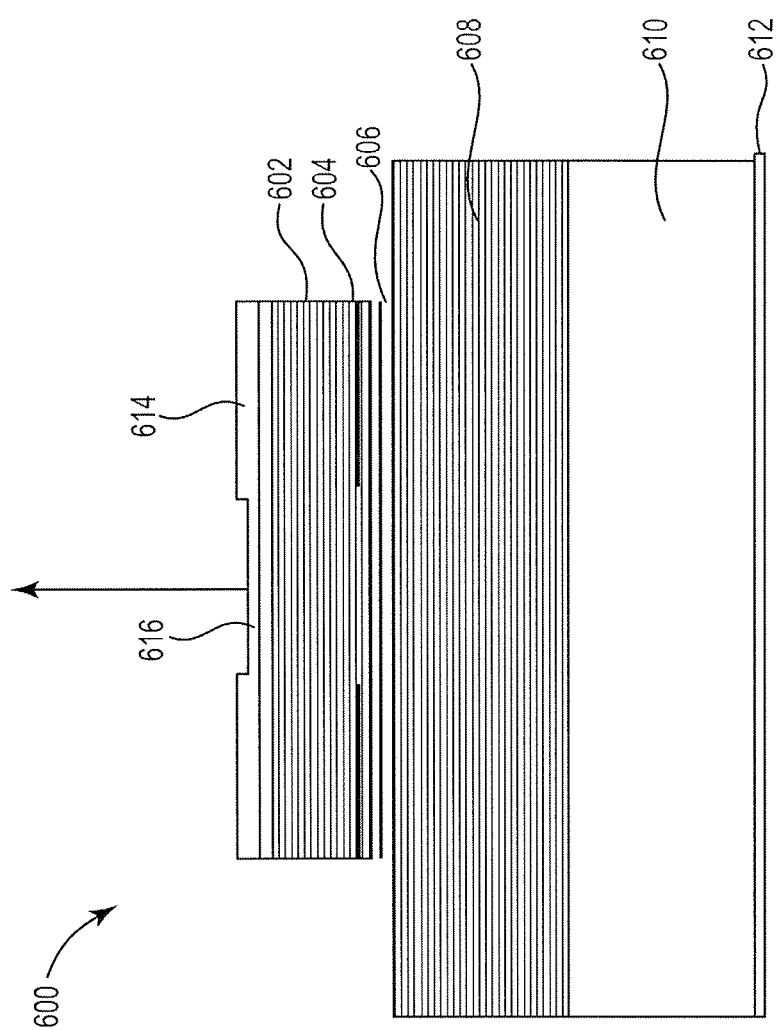
FIG. 6 is a schematic cross-sectional view of a VCSEL device, according to one or more embodiments.

FIG. 6 illustrates a cross-section of another VCSEL device 600. The VCSEL device 600 may have one or more mirrors, such as two mirrors 602, 608 with a light generating quantum well active region 606 and an oxide aperture 604 between the two mirrors. The mirrors may be referred to as upper 602 and lower 608 mirrors. The mirrors 602, 608 may each include a stack of two alternating compositions with different refractive indices. Each layer in the mirror may be one quarter wavelength thick, or an odd number of quarter wave thick layers. As an example, the mirrors can consist of alternating quarter wave thick layers of AlxGa(1-x)As layers. In one layer x may equal 0.1 and in the other layer, x may equal 0.85. In some embodiments, one mirror may be doped n-type and the other mirror may be doped p-type so that the p-n junction is located at the quantum well active layers between the mirrors. If grown on a conducting substrate 610, one contact to the device can be made by depositing a uniform metal layer 612 on the back side of the wafer. A metal contact 614 may be patterned on the top side of the wafer, leaving openings for the light to be emitted, and a wire bond can be used to connect the top contact of the VCSEL to the package. The VCSEL device 600 may have a dielectric cap 616 arranged at an opening of the metal contact 614. The VCSEL may be designed with a relatively high reflectivity for the bottom mirror 608 (i.e. many mirror periods) and a slightly lower reflectivity for the top mirror 602 so that the light is emitted primarily through the top surface. Any light emitted toward the substrate 610 will typically be lost to absorption in the substrate or the bottom metal contact 612. To avoid the absorption of light in the bottom metal contact 612, an ITO (Indium Tin Oxide) contact layer may be used, or a very thin metal layer that would allow some transmission.

Figure 7:
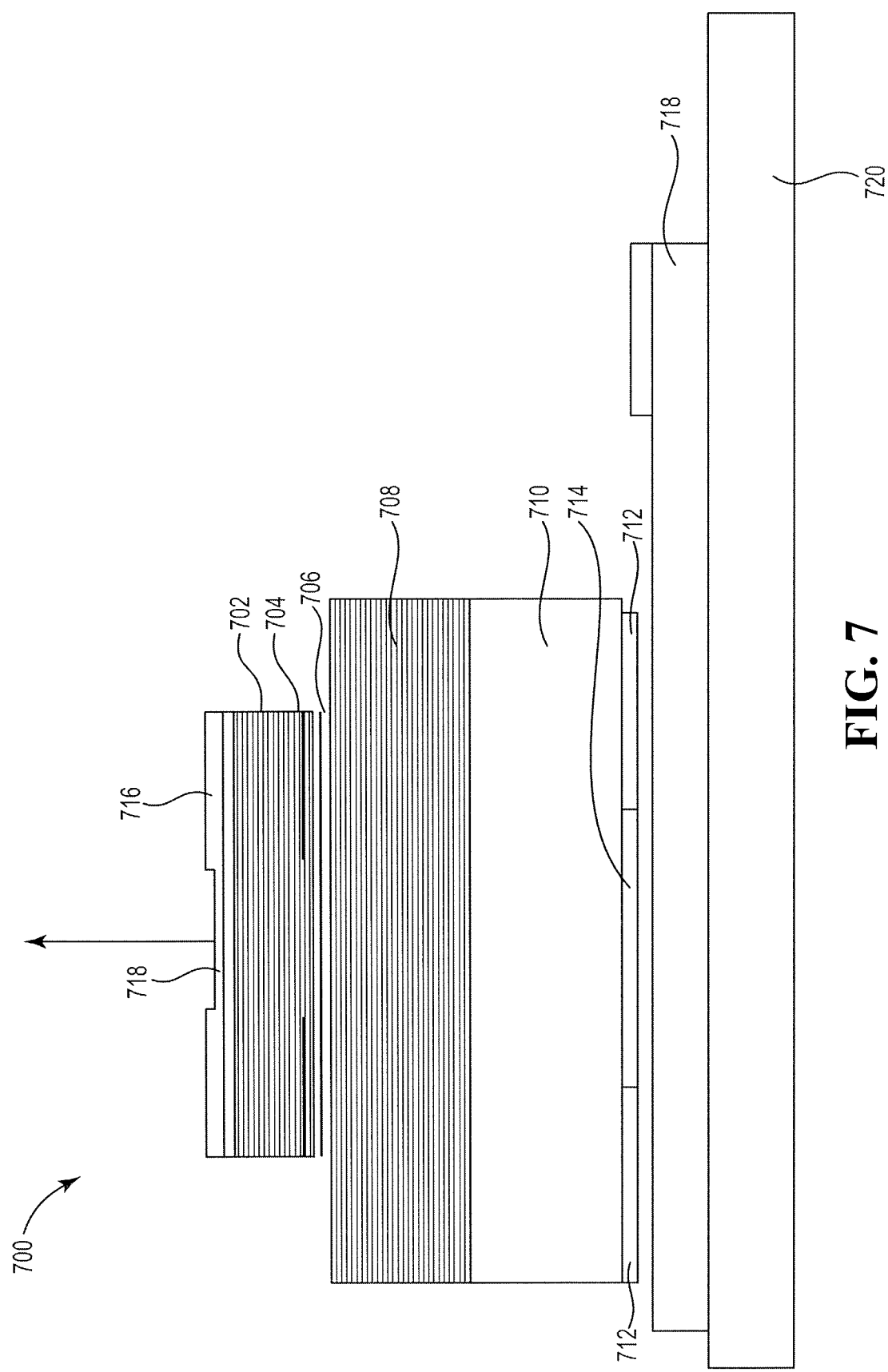
FIG. 7 is a schematic cross-sectional view of a VCSEL device having a patterned metal contact layer, according to one or more embodiments.

Alternatively, another VCSEL device is illustrated in FIG. 7. As described above, typically a VCSEL is designed with one mirror transmitting almost zero light (<1%), and the other mirror (usually on the top side of the wafer) being designed to be the light emission surface. However, by adjusting the reflectivity of the two mirror structures by controlling the number of mirror periods, one can adjust the relative percentages of light emitted from each end of the cavity. For example, emission ratios of 10%/90%, 30%/70% or 50%/50% can be achieved by adjusting the number of mirror periods and hence the reflectivity of each mirror.

Therefore, the schematic of FIG. 7 illustrates a device 700 designed to emit most of the light from the top surface, and a smaller fraction through the bottom mirror and the GaAs substrate. Like the VCSEL device 600, the VCSEL device 700 may have a top mirror 702, oxide aperture 704, active region 706, and bottom mirror 708 arranged on a substrate 710. The VCSEL may further have a top metal contact 716 and a dielectric cap 718. Additionally, the VCSEL device 700 may have a bottom metal contact 712. Further, to allow for power monitoring, the bottom metal contact 712 may be patterned, where the metallization is removed from an area that is in-line with the light emission direction of the VCSEL. A dielectric layer 714 can be deposited in the region from which the metal is removed to protect the surface and form an anti-reflection coating. Without the anti-reflection coating, an additional cavity could be established between the bottom of the substrate and the bottom mirror, leading to some modulation of the bottom output of the VCSEL as a function of current and/or temperature.

Figure 8:
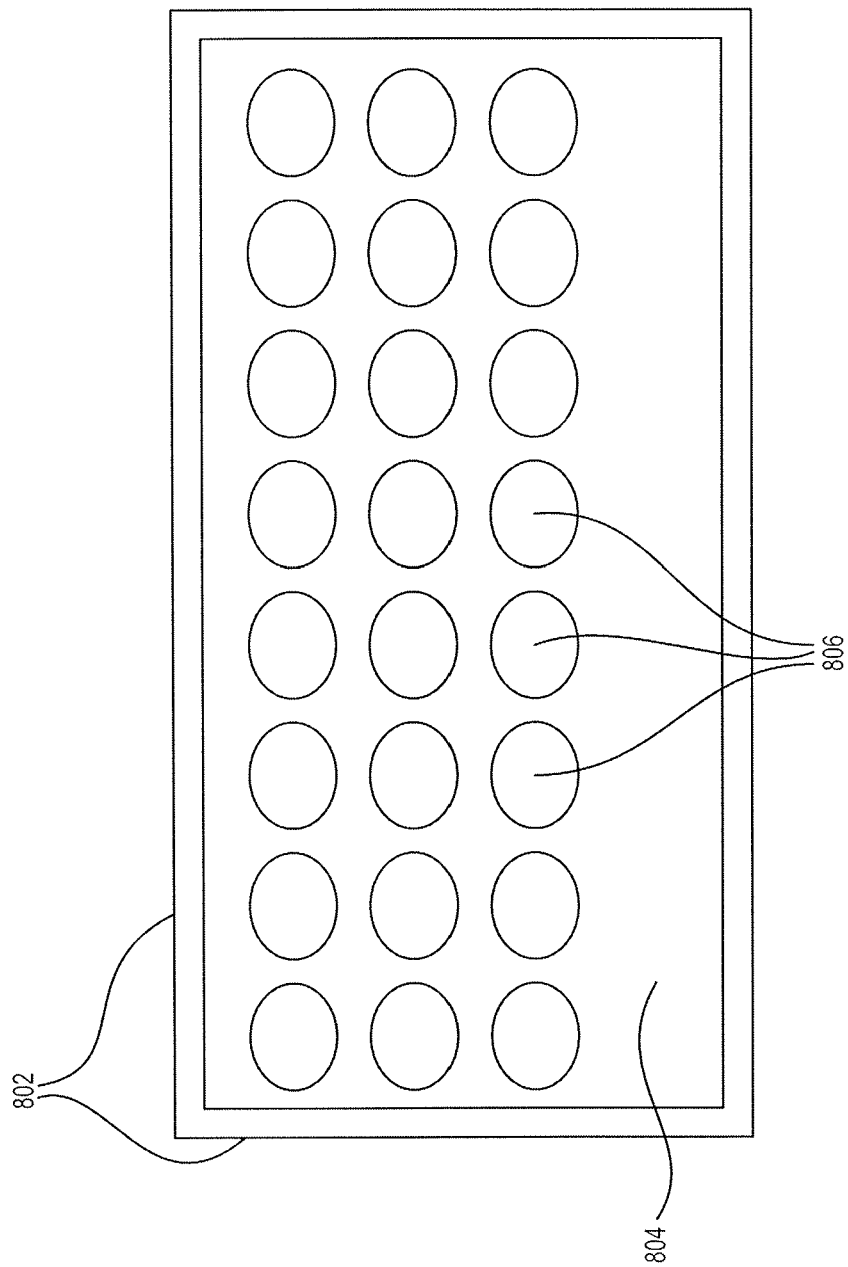
FIG. 8 is an example schematic diagram of a patterned metal contact layer of the VCSEL device of FIG. 7, according to one or more embodiments.

The opening in the metal 712 on the bottom side of the VCSEL die can also serve to filter out the light which is spontaneously emitted, and which is emitted in a Lambertian pattern, and yet still allow the lasing light, which is emitted substantially perpendicular to the substrate to exit the chip. FIG. 8 shows an image of one embodiment of the metal pattern on the back side of the wafer. In particular, FIG. 8 shows a back or bottom surface of a substrate 802 with a metal layer 804 arranged thereon and having a plurality of patterned openings 806. An anti-reflective dielectric coating may be arranged in the openings 806 of the metal 804, surrounded by the round metal contact. An opening 806 of approximately 30 μm may be provided for a single mode VCSEL with an aperture size less than or equal to 6 μm in some embodiments. This subtends a half angle of 5.7 degrees for a substrate thickness of 150 μm, and a half angle of 8.5 degrees for a 100 μm thick die. However, bottom side metal openings 806 ranging from 10 μm to 100 μm can be envisioned. A single layer anti-reflective coating may desirably be designed to be a quarterwave thickness of a material with a refractive index which is the square root of the product of the refractive index of GaAs and the refractive index of air or the material which is next to the substrate. At 940 nm the refractive index of GaAs is approximately 3.5, so for an interface to air (refractive index equals 1) the anti-reflection coating should preferably have a refractive index of 1.87 and a thickness of approximately 125 nm. Anti-reflective coatings can also be designed that consist of multiple layers.

With reference back to FIG. 7, to monitor the output of a VCSEL device 700, the VCSEL may be mounted directly on top of a silicon photodiode 718 that is sensitive to light up to wavelengths of approximately 1000 nm. For example, FIG. 7 shows a photodiode arranged 718 between the bottom metal layer 712 and a submount 720. The light emitted via the bottom mirror 708 through the bottom of the VCSEL, through the opening in the metal layer 714, is detected by the silicon photodiode 718, while the remainder of the light is emitted via the top mirror 702 from the top surface and used as illumination in a variety of sensors or communication systems. Other types of detectors with sensitivity in the wavelength range greater than 870 nm can also be used.

Figure 9B:
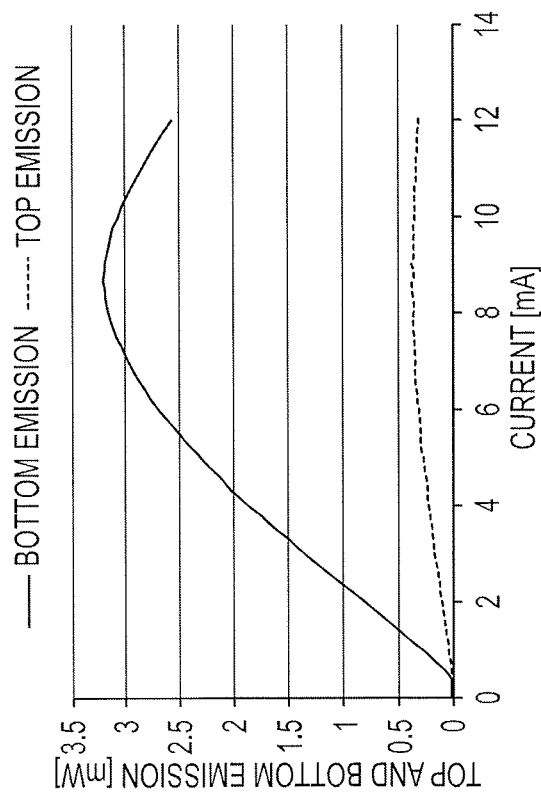
FIG. 9B is another graph illustrating output power versus input current for a bottom emission and top emission of a VCSEL device, according to one or more embodiments.
Figure 9A:
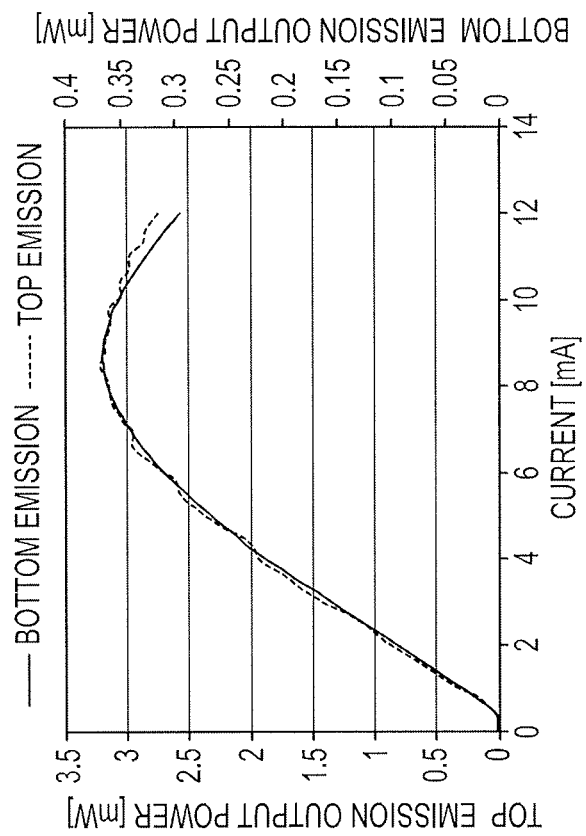
FIG. 9A is a graph illustrating output power versus input current for a bottom emission and top emission of a VCSEL device, according to one or more embodiments.

FIG. 9 illustrates the performance of such a monitoring arrangement. FIG. 9A shows a plot of output power versus input current for both the light detected from the top of a 940 nm VCSEL and the bottom of the same 940 nm VCSEL. This VCSEL was designed to emit 90% of the light from the top surface and 10% through the substrate. The peak output power was 3.2 mW from the top surface, while the peak power from the bottom side was around 0.37 mW for a total power of 3.57 mW. The ratio of power emitted from the top surface to total power was 3.2/3.57=0.896, very close to the design target of 0.9.

In FIG. 9B, the output power versus current from the top and the bottom were plotted on two different axes, with the ranges chosen so the two plots would overlap as much as possible. From this plot it can be seen that the output power through the bottom of the VCSEL tracks the power from the top quite accurately, which means that the monitoring would function very well. One can see a small amplitude of modulation on the signal from the back side. This would be much more enhanced without the anti-reflection coating.

As described previously, the number of mirror periods of the top and bottom mirrors may determine the reflectivity and the ratio of emission from the top surface versus the bottom. To achieve the power ratio illustrated in FIG. 9, the number of mirror periods of the bottom n-doped layer was 35, and the number of mirror periods of the top p-doped mirror was 25. As another example, for a ratio of front emission power to back emission power of 2.5, the mirror periods could be 28 for the bottom n-type mirror, and 23 for the top p-type mirror. This corresponds to a reflectivity of 99.52% reflective top mirror, and a 99.82% reflective bottom mirror. Other power ratios may be obtained as well. The desired ratio of front emission to backside emission can be achieved in a wide variety of ways with different mirror compositions (and associated refractive indices), and different numbers of mirror periods.

The VCSEL device 700 of FIG. 7 may be particularly useful for wavelengths longer than 870 nm, where the absorption coefficient of the GaAs substrate drops to a relatively low value. For wavelengths less than 870 nm, GaAs may be relatively highly absorbing, so for shorter wavelength VCSELs built on a GaAs substrate, light emitted through the back mirror may be absorbed and might not be as useful for monitoring. However, the band edge of GaAs absorption is around 870 nm at room temperature, and so for longer wavelengths, the GaAs may become increasingly transparent. At around 930 nm the absorption may become negligible, so according to some embodiments, the technique described here may be useful above 870 nm, and may be particularly useful for emission wavelengths above 920 or 930 nm.

Figure 10A:
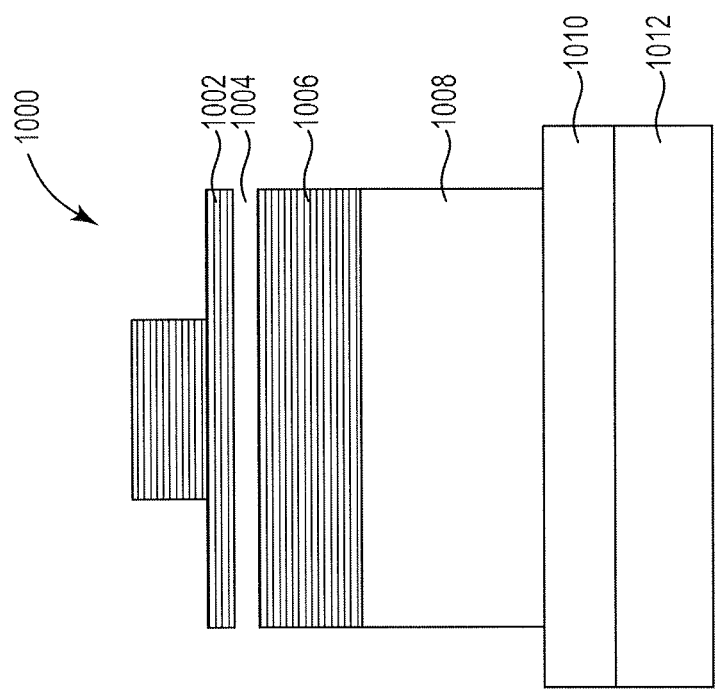
FIG. 10A is a schematic cross-sectional view of a VCSEL device, according to one or more embodiments.
Figure 10B:
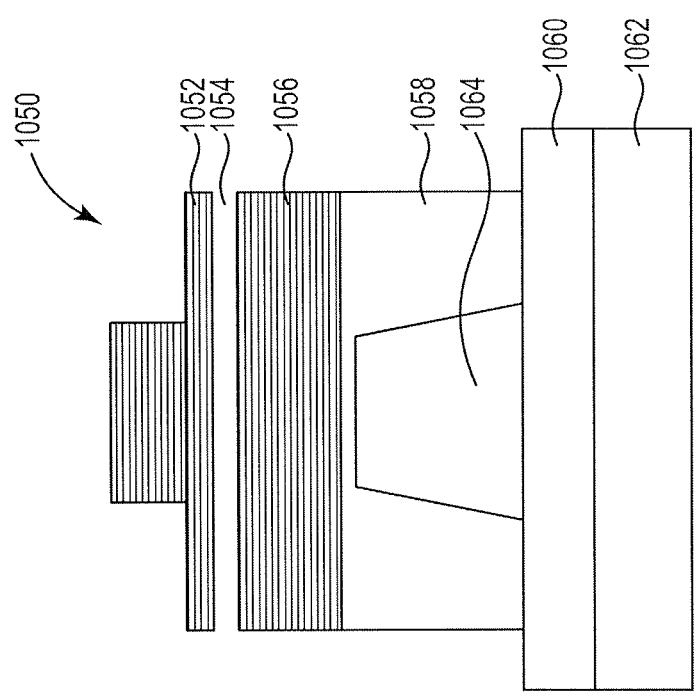
FIG. 10B is a schematic cross-sectional view of a VCSEL device having an etched substrate, according to one or more embodiments.

For VCSEL devices where the substrate is not transparent, the approach can be modified by etching away or otherwise removing the substrate below the VCSEL, as is illustrated in FIG. 10, for example. In particular, FIG. 10A shows a VCSEL device 1000 with a top mirror 1002, active region 1004, bottom mirror 1006, and a substrate 1008, which may be a transparent substrate, arranged over a photodiode 1010. A filter 1012, such as a Fabry-Perot filter, may be arranged between the substrate and the photodiode. A patterned metal contact may be arranged on a bottom surface of the transparent substrate. Alternatively, FIG. 10B illustrates a VCSEL device 1050 with a top mirror 1052, active region 1054, bottom mirror 1056, and a substrate 1058 with an etched area 1064. The etched region 1064 of the substrate 1058 may be aligned beneath the VCSEL so as to align with, and receive, light emitted through the bottom mirror 1056. The VCSEL device may be arranged over a photodiode 1060, and a filter 1062, such as a Fabry-Perot filter, may be arranged between the photodiode and the etched substrate. A patterned metal contact may still be deposited and patterned on the un-etched portions of the substrate. For discrete devices, the etched area diameter might be in the range of 25 to 100 μm. For an array, the etched diameter could be the full array size, and might be a variety of shapes such as round or rectangular. For a 1 mm array size, the etched area might be slightly larger than 1 mm. In this case, the metal may be deposited in the etched area, directly on the bottom mirror, to provide the filtering of the spontaneous emission.

These approaches to monitoring the output power of the VCSEL, described with respect to FIGS. 6-11, do not require an external reflective surface. In each case, the VCSEL sits on a photodiode, whose thickness can easily be chosen to be as thin as 0.05 mm, but more typically might be smaller than 0.2 mm or in the range of 0.1 mm to 0.2 mm, and hence a package incorporating the VCSEL and monitor function can be relatively low profile. Other photodiode thicknesses are contemplated as well.

The use of the patterning of the backside metal has a simplicity and cost advantage over other approaches, such as inserting an angle selective filter between the VCSEL and the photodetector. The metal patterning generally includes the addition of one simple mask-based patterning step to the VCSEL wafer fabrication, and no additional assembly steps. The use of a separate filter requires fabrication, singulation, and assembly of the filter element.

Another approach to power monitoring may involve metal patterning of the silicon photodiode. A similar sized metal aperture (10-100 μm) could be patterned, and it may also block most of the spontaneous emission from the VCSEL. Since metal contacts may already need to be patterned on the photodiode, this could be achieved by simply changing the mask pattern, without any additional fabrication steps.

Figure 11:
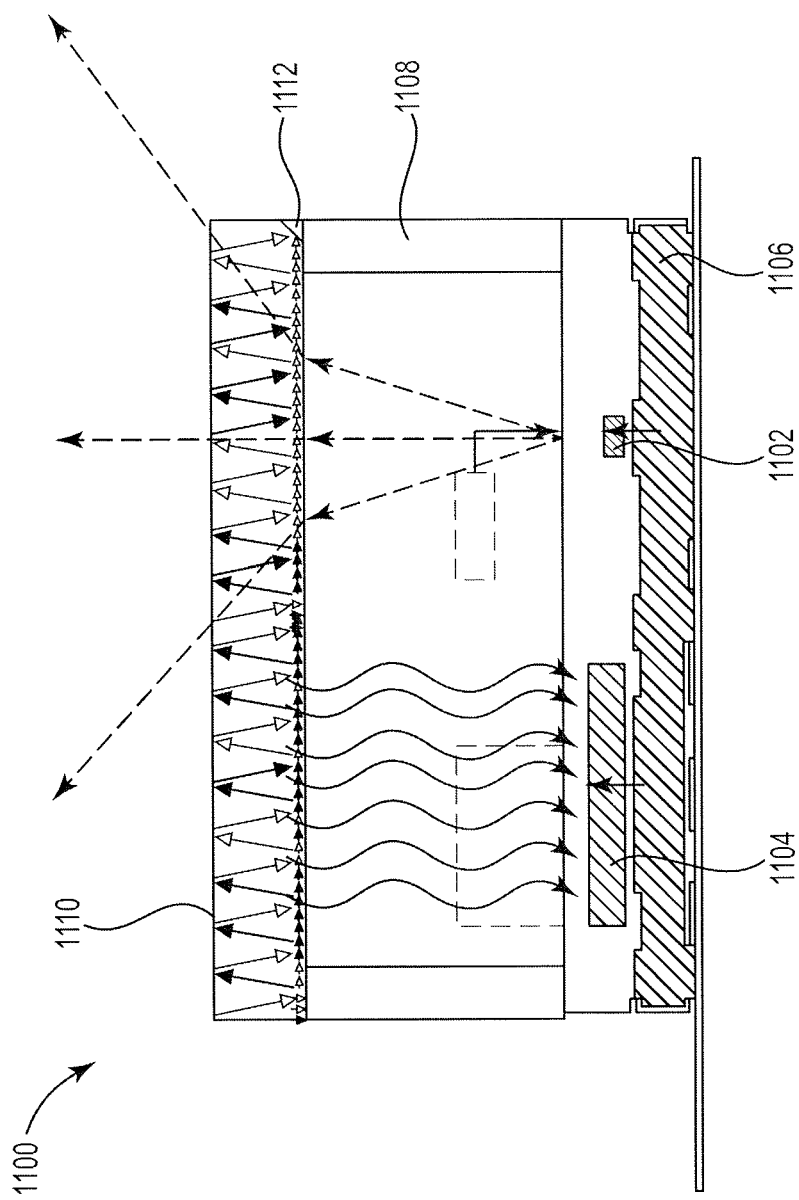
FIG. 11 is a schematic cross-sectional view of a VCSEL package, according to one or more embodiments.

An approach for monitoring the output of a VCSEL in a low-profile package without the use of a back-monitor diode is illustrated in FIG. 11. The approach may include a window in the package, but rather than using simple reflection from the window, a diffuser may be incorporated into the window. A diffuser can consist of ground glass, or can be a structure etched or embossed into a glass or polymer material. Diffusers can scatter light into a wider range of angles, and some light will be reflected from the top surface of the window, and thus transferred laterally within the glass.

A higher percentage of light may reach a further lateral distance away from the VCSEL. Eventually some light can be scattered back into the package. Since the light can be repeatedly scattered and reflected along the glass or plastic window for some lateral distance, the window generally may not need to be placed as high above the VCSEL as in the reflective case, and hence a lower profile package can be achieved.

As shown in FIG. 11, the package 100 may include a submount 1106, one or more spacers 1108, and a top window 1110. The inside or outside surface of the window 1110 can be partially or completely covered with a diffuser 1112. In some embodiments, the inside surface of the window 1110 may be preferred for placement of the diffuser 1112 for better performance and to avoid contamination. A VCSEL chip 1102, which can be either a discrete VCSEL, or an array of VCSELs, is mounted on the submount 1106. A photodetector 1104 is also mounted on the submount 1106, located laterally from the VCSEL chip. The diffuser 1112 may be ground glass, or an engineered diffuser, with a pattern etched or molded into glass, or etched, molded, or embossed into a polymer material that can have a glass, polymer, or other substrate transparent to the emitted laser light. These pseudo-random, non-periodic structures can manipulate light by changing the direction of its energy and with proper design can direct light into a pre-determined angular field of view. Most of the light emitted from the VCSEL chip 1102 may be transmitted through the diffuser window and fill this angular field of view, but a percentage (from a few percent to 15% or greater) may be repeatedly scattered and reflected parallel to the plane of the window, and some can be scattered again by the diffuser back into the package and can reach the photodiode 1104.

The configuration in FIG. 11 allows the package to have a relatively low profile, while still allowing for output monitoring. The size of the photodiode signal may be less sensitive to the height of the window 1110, than is true when a reflection mechanism is used. For the example shown in FIG. 11, the submount plus optical die thickness may be approximately 0.38 mm, the spacer may have a thickness of approximately 0.76 mm, and the diffuser window may have a thickness of approximately 0.4 mm. The overall thickness of the package may be approximately 1.6 mm, including the epoxy used to assemble the package. In other embodiments, the overall thickness of the package may be less than 2 mm, less than 2.5 mm, less than 3 mm, or any other suitable thickness. The VCSEL and photodiode thicknesses are typically in the range of 0.1 to 0.2 mm thick. For 0.15 mm thick VCSEL and photodiode, the distance from the tops of the chips to the bottom of the diffuser is approximately 0.6 mm. For comparison, if a reflective approach for monitoring the output is used, the spacing would need to be significantly higher. For example, let's assume a VCSEL array, with a linear dimension of 1 mm, and a photodiode with a linear dimension of 1 mm. Let's also assume that we want light emitted from the middle of the VCSEL chip to be able to reach the middle of the photodiode. The lateral distance between the middle of the two chips would need to be greater than 1 mm, i.e. half of the VCSEL linear dimension plus half of the photodiode linear dimension plus any space that exists between the two chips. The VCSEL light is generally emitted in a round cone, and the angle at which the light drops from peak intensity to $1/e^2$ of the peak intensity can be approximately 11 degrees for a multi-mode VCSEL. If we therefore require that light emitted at 11 degrees or greater from normal from the middle of the VCSEL chip reaches the middle of the photodiode chip, the height of the window above the VCSEL and photodiode chips would need to be approximately 2.6 mm, resulting in a total package thickness of approximately 3.6 mm, or more than twice as thick. Clearly the use of the diffusive mechanism may allow for a much lower profile package.

Figure 12:
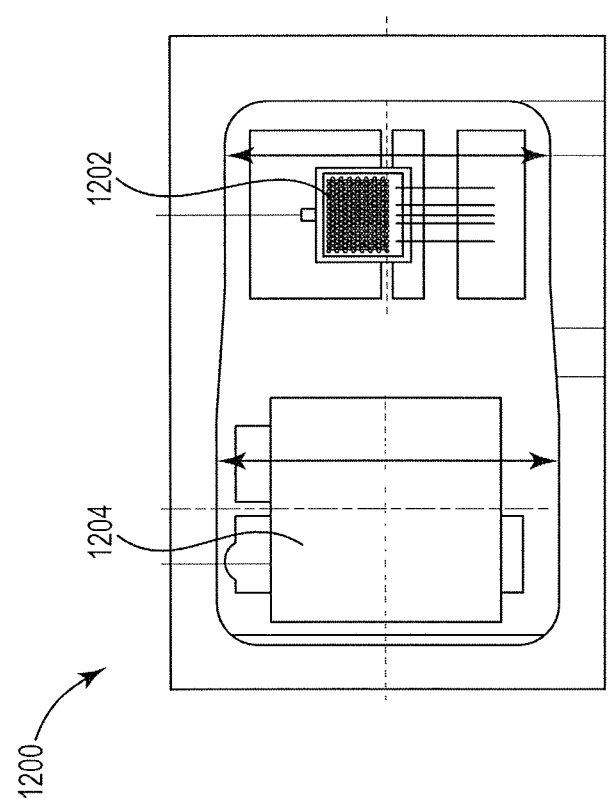
FIG. 12 is an example schematic plan view of a VCSEL package, according to one or more embodiments.
Figure 13:
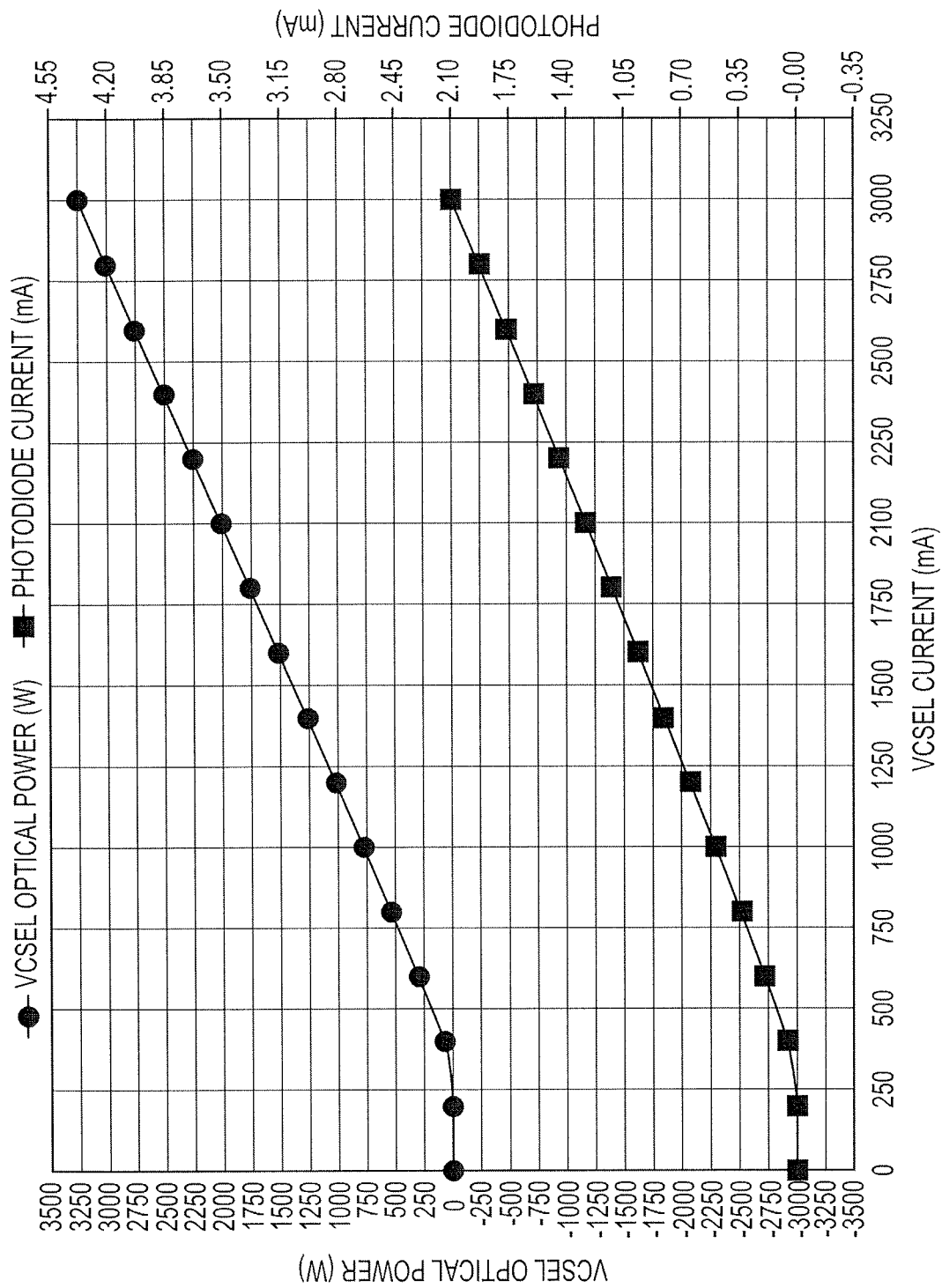
FIG. 13 is a graph illustrating current input of a VCSEL array versus optical power and current detected by a photodiode, according to one or more embodiments.

FIG. 12 is a schematic of the plan view of a package 1200 as seen from the top with the diffuser removed. The spacer may be located around the edge, and the schematic shows the placement of the VCSEL chip 1202 and the photodiode chip 1204 in this particular layout. A center of the VCSEL chip 1202 and a center of the photodiode 1204 may be laterally separated by a distance of approximately 2 mm or 2.1 mm in some embodiments. In other embodiments, centerpoints of the VCSEL chip 1202 and photodiode 1204 may be laterally separated by a different distance. A package with this layout, incorporating the VCSEL, photodetector, and diffuser mounted on top was tested and the results are illustrated in FIG. 13. The distance between the center of the VCSEL chip and the center of the photodiode chip is 2.12 mm. Both chips are mounted onto a pad on the submount with conductive epoxy, and the metal contacts on the top surface are wire bonded to another pad. As shown in FIG. 11, the location of the diffuser surface is approximately 0.76 mm above the top surface of the VCSEL.

FIG. 13 illustrates the output power of the VCSEL array and the signal detected by the photodiode, according to one embodiment. The scale for the VCSEL output power is on the left side of the plot, and the scale for the photodiode current resulting from detection of the light is on the right. The x-axis is the current input into the VCSEL array. One can see that the threshold current for the beginning of lasing is approximately 300 mA. This is reflected in the photodiode response, where current resulting from the detection of light, also begins to increase at the same threshold current. In addition, the slope of the photodiode current is relatively linear with the amount of optical power emitted from the VCSEL chip. If we define an effective system responsivity (note this is not just the photodiode responsivity) as the current generated in the photodiode versus the total amount of power emitted from the VCSEL array, it is calculated to be 0.65 mA/W. This considers all the sources of loss: the responsivity of the photodiode itself, the amount of light transferred laterally by the diffuser (i.e. not transmitted by the package), and the amount of light scattered back into the package which hits the active area of the photodiode.

Figure 14:
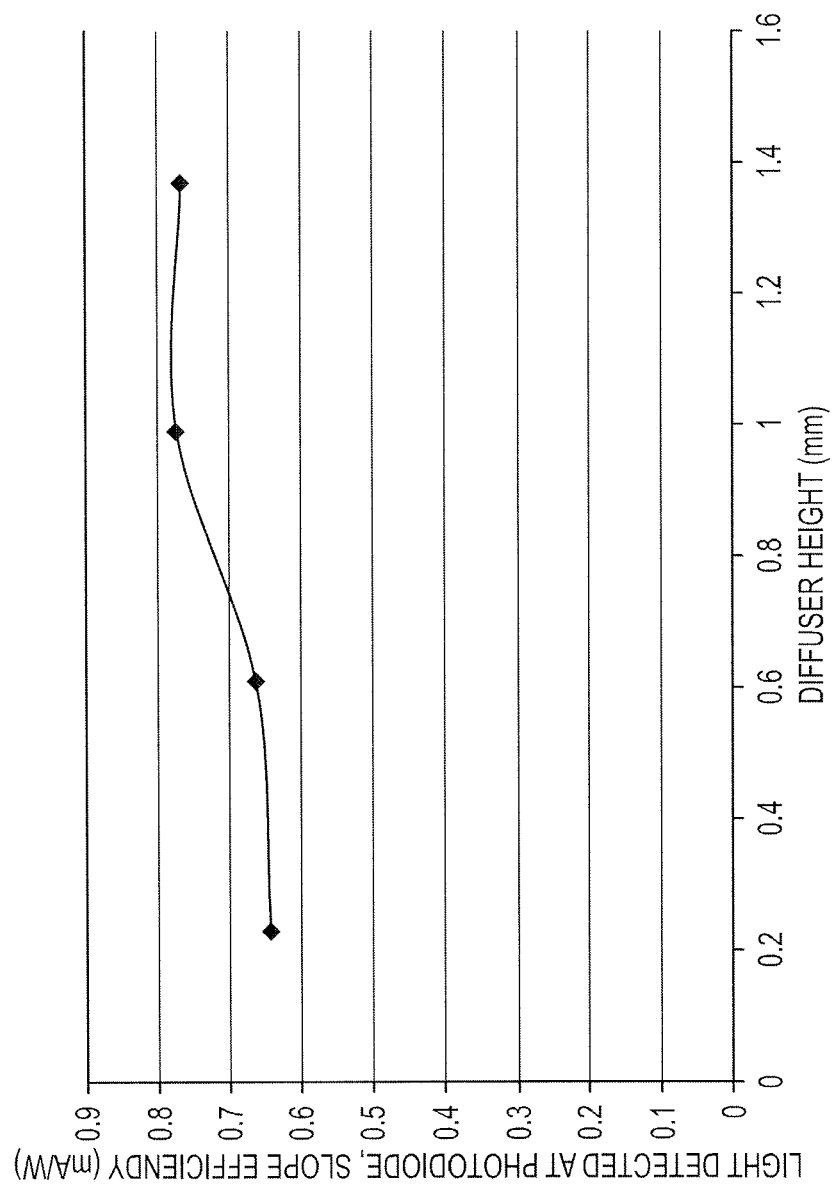
FIG. 14 is a graph illustrating responsivity of a photodiode as a function of height of the diffuser surface above the surface of the VCSEL and photodiode, according to one or more embodiments.

FIG. 14 is a plot of the responsivity of the photodiode as a function of height of the diffuser surface above the surface of the VCSEL and photodiode. Again, in this case, we define responsivity as the power detected by the photodiode versus the power emitted from the VCSEL. As one can see there is some dependence of the responsivity versus the diffuser height, but it is relatively weak. The weak dependence of the system responsivity versus height is also a benefit, allowing for improved tolerance.

Figure 15:
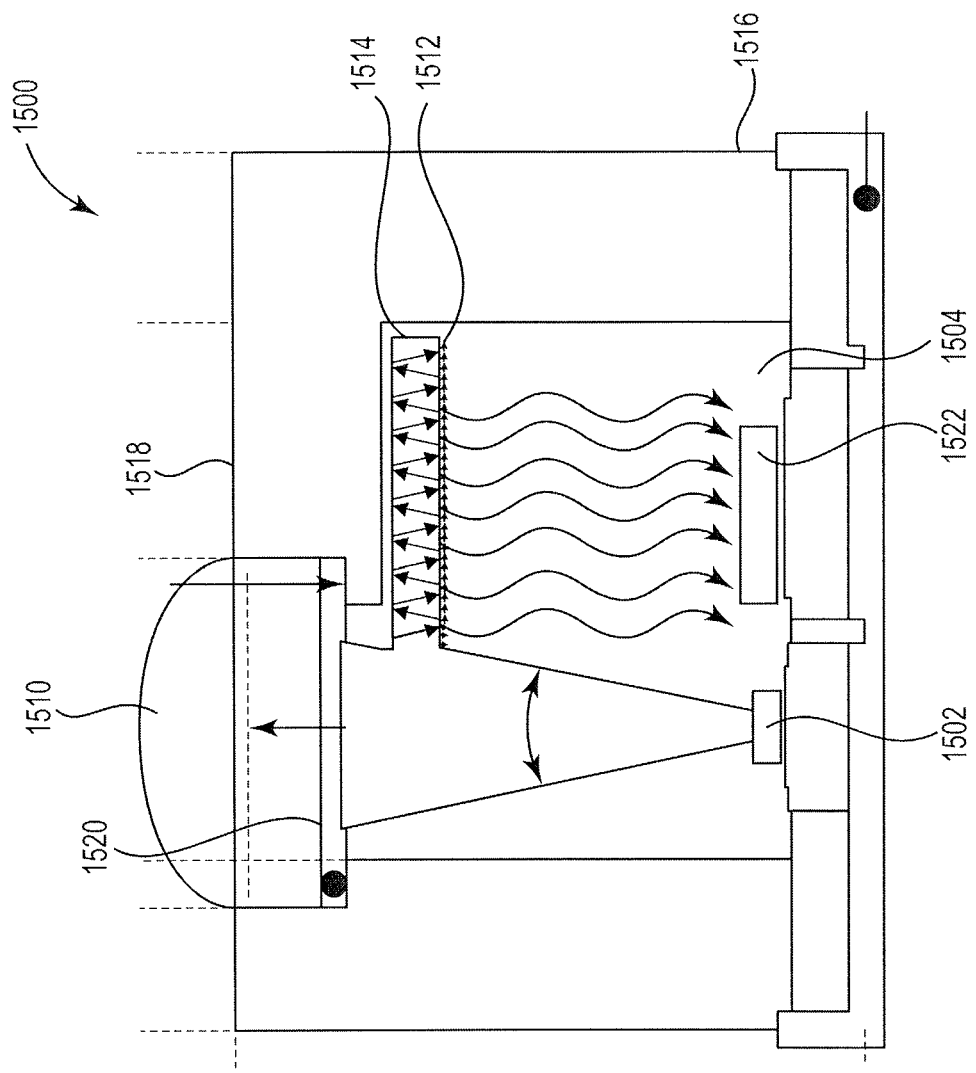
FIG. 15 is a schematic cross-sectional view of a VCSEL package, according to one or more embodiments.

FIG. 15 illustrates another design for creating a low-profile package with a monitor diode. In this case, the design is intended to minimize the amount of ambient light from outside of the package, i.e. not generated by the VCSEL, from reaching the photodiode. As before, the VCSEL chip 1502 and photodiode monitor 1504 may be placed in the base of the package 1500. In this case, the diffuser 1512 may be off to the side, i.e. not directly above the VCSEL chip 1502. The majority of the VCSEL light may pass through a lens 1510, or just a planar window. The diffuser 1512 may be placed so that it subtends just the higher angles of the light emitted from the VCSEL chip 1502, and transfers some of this light laterally and then back down onto the photodiode monitor 1504 through scattering at the diffuser surface. This diffuser 1512 could be just to one side of the VCSEL chip 1502, or could be designed to surround the VCSEL chip, with an opening in the middle to allow most of the VCSEL light to pass through. To minimize light reaching the diffuser 1512 region from the outside and to maximize the portion of the light scattered by the diffuser that reaches the photodiode 1504, a reflective coating 1514 such as gold or a dielectric reflective coating may be deposited on the other surface of the glass or plastic diffuser. As the light that is scattered into the diffuser window travels laterally, it may generally be prevented from escaping from the top surface. This reflective coating 1514 also may prevent light from outside of the package from being transmitted into the diffuser and package. In addition, opaque package walls 1516 and an opaque covering 1518 outside the VCSEL emission area may help protect the photodiode 1504 from exposure to unwanted ambient light.

As described above, the diffuser 1512 could be located off to one side, such as the same side as the photodiode 1504, as shown in FIG. 15. It could also be a round or rectangular diffuser with a clear hole in the middle allowing for the transmittal of most of the VCSEL beam. To increase the total signal, monitor photodiodes 1504 could be on one or more sides of the VCSEL chip 1502. Additionally, the VCSEL chip 1502 could be mounted on top of a much larger photodiode 1504. The middle of the photodiode 1504 could be covered by a metal layer to prevent the detection of ambient light that is transmitted through the clear part of the window or lens 1510, while the outer portions are left open to detect light scattered from the diffuser 1512. This arrangement can further maximize the magnitude of the signal detected by the monitor photodiode. Another approach to minimize the effect of ambient light would be to place a filter 1520 on the clear, non-diffuser area of the window 1510, and additionally or alternatively to place a filter 1522 on the photodiode 1504 itself. These may be s notch filter or notch filters that would allow the VCSEL wavelength through with a bandwidth that could range from, for example, 1 to 50 nm, but reject wavelengths outside this band.

These features combined can reduce the background signal caused by outside ambient light by several orders of magnitude. The rejection of ambient light is improved by the ability to use the diffuser to transfer the sampled light laterally away from the package window, so that the photodiode is shadowed by the package and reflective top surface of the diffuser.

With respect to the embodiments described above, the signal received by the photodiode can be used in a number of ways. It can be fed back to the control of the VCSEL driver to maintain a desired output power or output power range for a minimum signal magnitude in a sensor. On the other hand, the output power can be reduced to keep the power within eye safe levels. An alternative use of the VCSEL plus photodiode monitor can be for self-mix applications, where the signal emitted by the VCSEL is reflected from a target and re-enters the VCSEL causing the output to modulate. The output modulation may then be monitored with the photodiode. Motion or vibrations can be detected with high resolution.

As previously mentioned, some examples of the use of the photodetector signal include maintaining a constant power over temperature or ensuring eye safety. In addition to using the photodiode monitor to control the power due to standard operating conditions such as varying power due to varying temperature, some of the events impacting eye safety can include the diffuser or micro lens falling off the package, breakage of the diffuser, melting of the diffuser coating, or liquid condensing on the diffuser surface.

Figure 16:
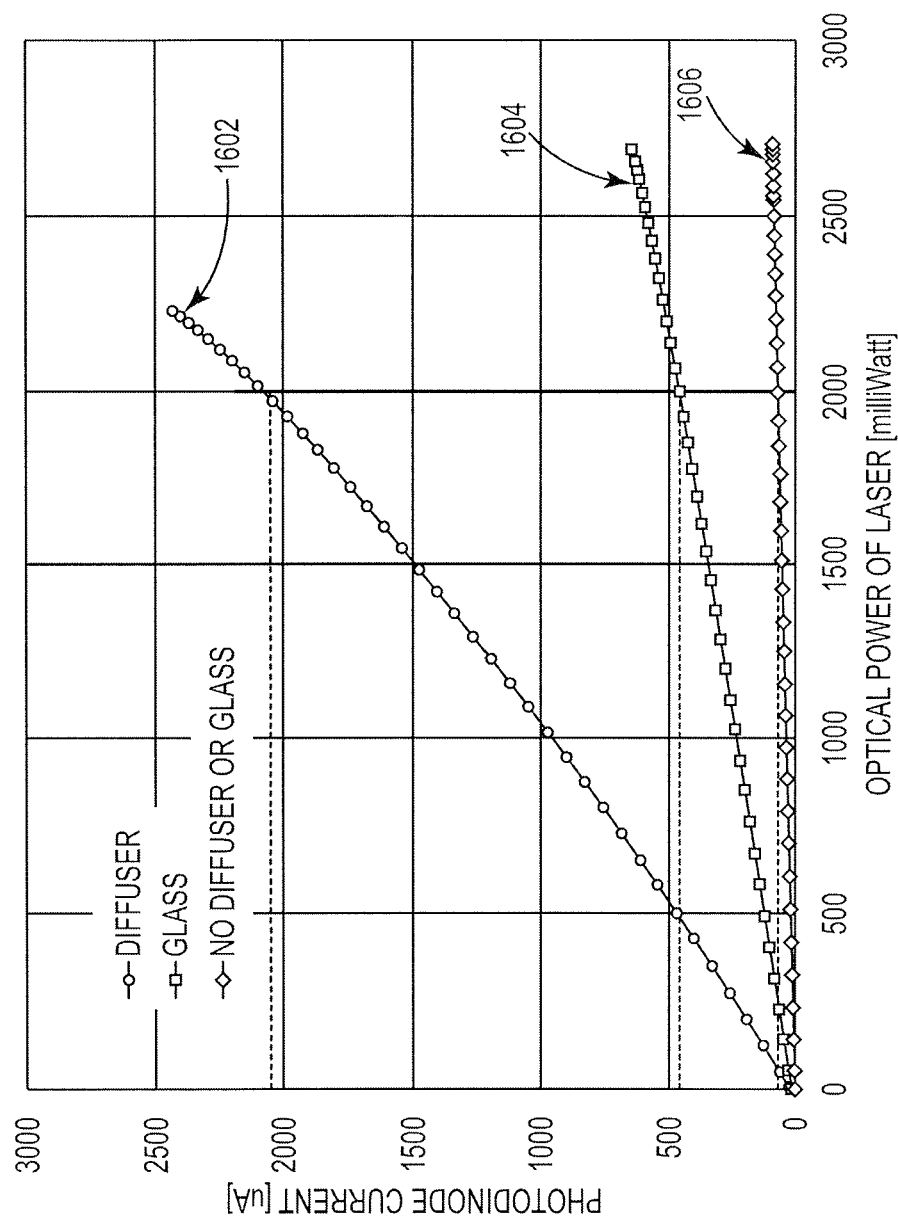
FIG. 16 is a graph illustrating a signal detected by a photodetector mounted in a package plotted against the output power from a VCSEL die in the package, according to one or more embodiments.

As shown in FIG. 16, the signal from the photodetector packaged with a VCSEL array can be used to detect and determine certain failure or change modes of the VCSEL package. Specifically, FIG. 16 is a plot of photodiode current as a function of the optical power of the laser. As shown in FIG. 16, a signal detected, for example, by the photodetector mounted in a package in the manner illustrated in FIGS. 11 and 12, is plotted as a function of the output power from the VCSEL die. Three cases are shown: a) the photodiode signal 1602 detected with an intact diffuser in place as the lid of the package, b) the photodiode signal 1604 detected with a plain glass (no diffuser, lens, or DOE) in place as the lid of the package, and c) the photodiode signal 1606 detected with no lid on the package, i.e. no diffuser, lens, DOE, or plain glass lid. As can be seen from the plot, the signal 1604 drops significantly (approximately a 4× drop), with the plain glass lid as compared to with the diffuser in signal 1602. The signal 1606 is even lower when there is no lid at all, with a drop of >10× as compared to the diffuser signal 1602, most likely just corresponding to noise resulting from scattered light.

Figure 17:
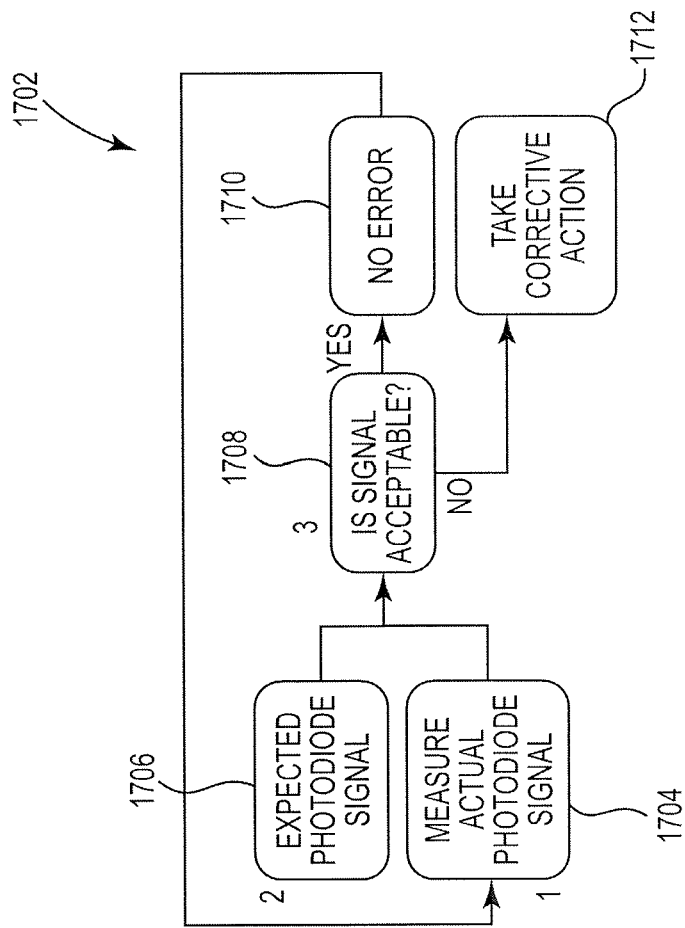
FIG. 17 is a process flow decision tree to detect failure and take the appropriate action, according to one or more embodiments.

To determine failure or other change events, electronics, hardware, and/or software can be used that can compare the anticipated photodiode signal to actual photodiode circuit. FIG. 17 illustrates a process flow decision tree 1702 to detect failures and take the appropriate action. In some embodiments, detection and reaction to VCSEL package failures can avoid unsafe states, such as where eye safety may be a concern. If the expected photodiode signal falls outside an acceptable range, corrective action can be taken. What that corrective action will be will often depend on the application, but can include, and is not limited to, setting an error flag line to high, de-energizing the laser, or further processing of the result and conditions to determine the appropriate action to take.

As shown in FIG. 17, in one or more embodiments, a decision tree 1702 may include the steps of first measuring the actual photodiode signal 1704; comparing the measured photodiode signal to the expected photodiode signal 1706; determining whether the measured photodiode signal is acceptable 1708; and either sending a no error signal if the photodiode signal is acceptable 1710, or sending a take corrective action signal 1712 if the photodiode signal is not acceptable 1712. If no error is detected at step 1710, as shown in FIG. 17, the decision tree 1702 may return to the first step of measuring the actual photodiode signal 1704. In other embodiments, the method 700 may include additional and/or alternative steps.

The step of measuring the actual photodiode signal 1704 may be performed in any suitable manner, for example, by using the photodetector mounted in a package in the manner illustrated in FIG. 11 (photodiode chip 1104) or 12 (photodiode chip 1204). Other appropriate methods for measuring photodiode current may include using a transimpedance amplifier with comparator, transimpedance amp with ADC, and/or any other suitable electronic circuit. After measuring the actual signal 1704, the measured signal may be compared to the expected photodiode signal 1706 in any suitable matter, including but not limited to use of a microprocessor or comparator with level set by voltage, either analog or DAC. Once the method of decision tree 1702 determines whether or not the measured signal is acceptable at step 1708, the take corrective action signal step 1712 may further include triggering one or more corrective action measures, including by not limited to setting a digital line high flag error, removing power to the VCSEL using electronics, or further evaluating the laser current & voltage or system status to determine if an actual error occurred, as described herein further below.

Figure 18A:
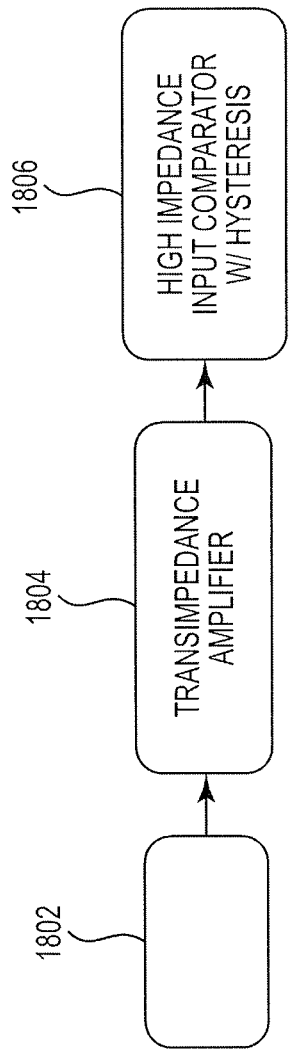
FIG. 18A is a process flow of a method for determining and setting a status signal in response to a measured photodiode current, according to one or more embodiments.
Figure 18B:
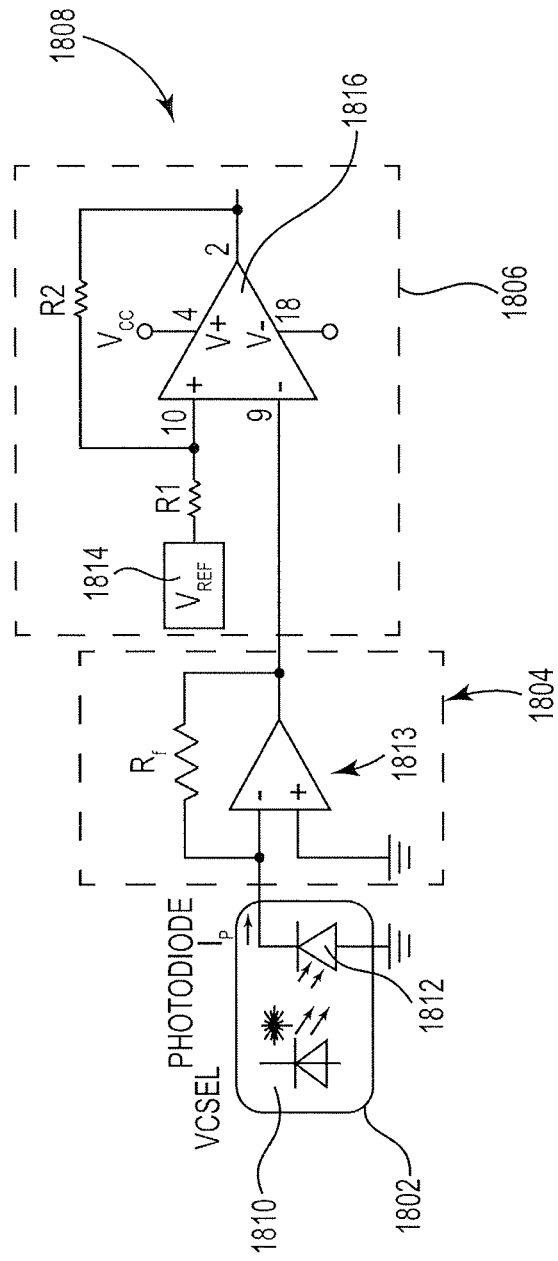
FIG. 18B is a schematic of a circuit that will set a particular signal depending on whether a photodiode is detecting the correct photodiode current, according to one or more embodiments.

FIGS. 18A and 18B illustrate one embodiment of a control unit for setting a digital signal to a high or low level depending on whether the photodiode detects a photodiode current within acceptable ranges. As shown in FIG. 18A, one method for setting a digital high or low signal in response to measured current utilizes an optical element 1802 having a photodiode, a transimpedance amplifier 1804, and a comparator 1806. In the illustrated embodiment, the optical element 1802 sends the current measurement from the photodiode to a transimpedance amplifier 1804 to convert the photodiode current into a voltage level. The transimpedance amplifier 1804 then sends the voltage level to a comparator 1806. The comparator 1806 then compares the provided voltage level to a predetermined reference level in order to determine if the measured signal from the photodiode is within acceptable levels. As generally shown in the decision tree 1702 of FIG. 17, in some embodiments the control unit can produce a signal depending on the result of the comparison. In one embodiment, a comparator 1806 may send a high signal if the measured current is greater than the reference level, and a low signal if the measured current is less than the reference level, although other arrangements are contemplated.

FIG. 18B illustrates one embodiment of a control circuit 1808 according to the present disclosure. As shown in the diagram, optical element 1802 may include a VCSEL package 1810 and photodiode 1812. In some embodiments, photodiode 1812 may send a signal Ip to transimpedance amplifier 1804. In the shown embodiment, a generic transimpedance amplifier function is implemented using an operational amplifier 1813, while in practice any current-to-voltage amplifier topology could be used. Next, the voltage generated by the photodiode 1812 is compared to an expected reference level 1814 at comparator 1806. In one embodiment, expected reference level 1814 as shown in FIG. 18B may be less than the current generated by a functioning diffuser, but greater than the other two failure mechanisms. As shown in FIG. 18B, comparator 1806 may comprise an amplifier 1816 configured as a comparator and change its output voltage between V+ and V− depending if the signal is in the acceptable range. In this case, the comparator 1806 is configured as a comparator with hysteresis in order to prevent false alarms, such as when there is noise on the signal. Expected reference level 1814 need not be a fixed voltage, but could be the output of a DAC that adjusts the comparison level depending on, for example, driving conditions, whether the laser is energized, or to adjust the level depending on environmental factors such as temperature. Other methods to set the level in electronics, hardware, firmware, or software would be clear to others practiced in the art.

Figure 19:
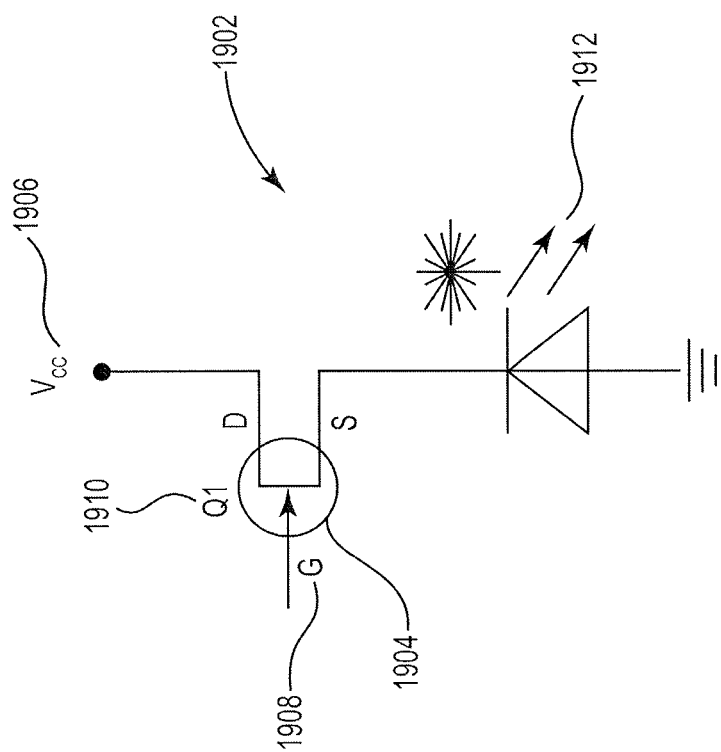
FIG. 19 is a schematic of a method to energize (enable) or de-energize (disable) a laser, according to one or more embodiments.

FIG. 19 shows one embodiment of a schematic according to the present disclosure in which to energize (enable) or de-energize (disable) an optical element, such as a laser in a VCSEL. In one or more embodiments, the circuit 1902 shown in FIG. 19 may use one or more of a variety of toggle mechanisms 1904, including but not limited to a FET, MOSFET, HexFET, or other high current, low impedance analog source to toggle the connection to power 1906 (Vcc) by adjusting the voltage value on the FET gate 1908 (G) of Q1 1910. The illustrated embodiment is just one method of many known in the art to control whether a coupled optical element or laser 1912 is energized or capable of being energized.

Figure 20A:
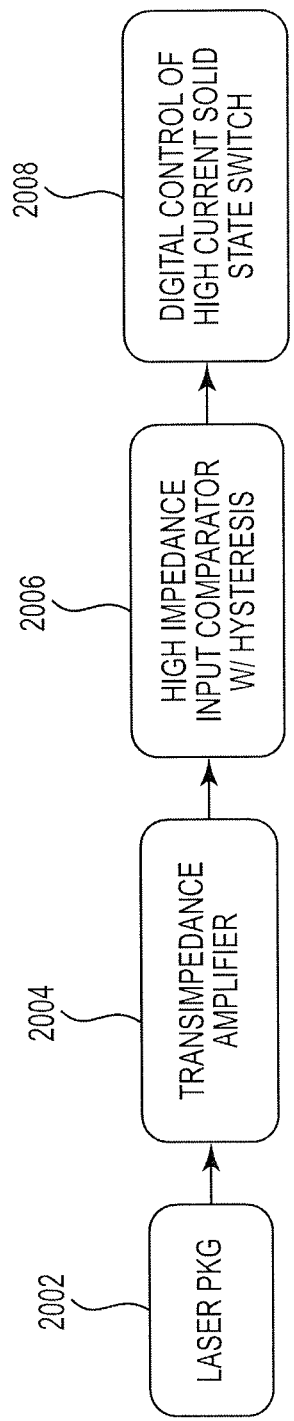
FIG. 20A is a process flow of a method for a detection scheme of the method for determining and setting a status signal shown in FIG. 18 integrated with the laser control toggle of FIG. 19, according to one or more embodiments.
Figure 20B:
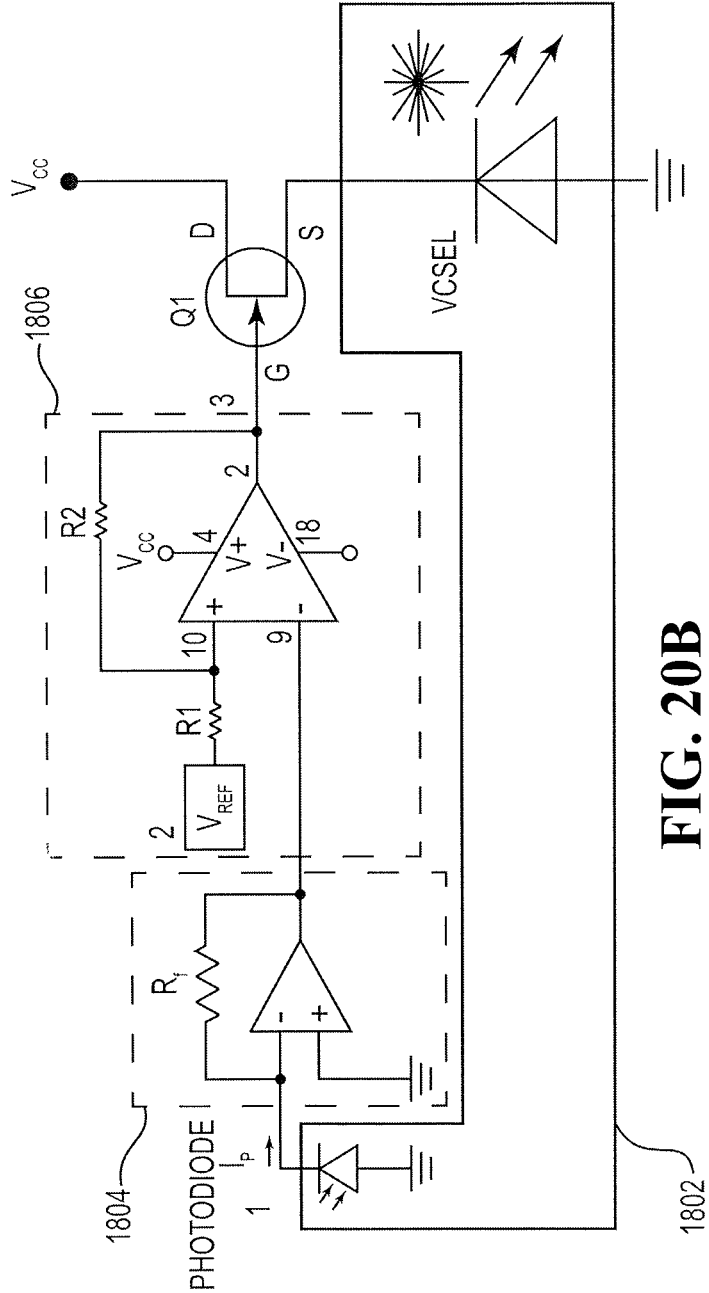
FIG. 20B is a circuit schematic for a detection scheme for setting a status signal shown in FIG. 18 integrated with the laser control toggle of FIG. 19, according to one or more embodiments.

FIG. 20A illustrates one embodiment a process flow of a method for a detection scheme of the method for determining and setting a status signal shown in FIG. 18 integrated with the laser control toggle of FIGS. 19A and 19B. As shown in FIG. 20A, one method for setting a digital high or low signal and laser power toggle in response to measured current utilizes an optical element 2002 having a photodiode, a transimpedance amplifier 2004, a comparator 2006, and a toggle unit 2008. In the illustrated embodiment, the optical element 2002 sends the current measurement from the photodiode to a transimpedance amplifier 2004 to convert the photodiode current into a voltage level. The transimpedance amplifier 2004 then sends the voltage level to a comparator 2006. The comparator 2006 then compares the provided voltage level to a predetermined reference level in order to determine if the measured signal from the photodiode is within acceptable levels. In some embodiments comparator 2006 may produce a signal depending on the result of the comparison, and send said signal to toggle unit 2008. Accordingly, in some embodiments, depending on the signal received by from comparator 2006, toggle unit 2008 may energize or de-energize optical element 2002. The embodiment shown in FIG. 20A represents a possible analog solution to automatically de-energize the laser if the signal at the photodiode is not high enough. Moreover, FIG. 20A represents a conceptual method of control; additional changes to the schematic as known to one skilled in the art may be necessary or desirable to account for start-up conditions or pulsed conditions. FIG. 20B illustrates a circuit schematic for a detection scheme for setting a status signal shown in FIGS. 18A and 18B integrated with the laser control toggle of FIG. 19, according to one or more embodiments.

Figure 21A:
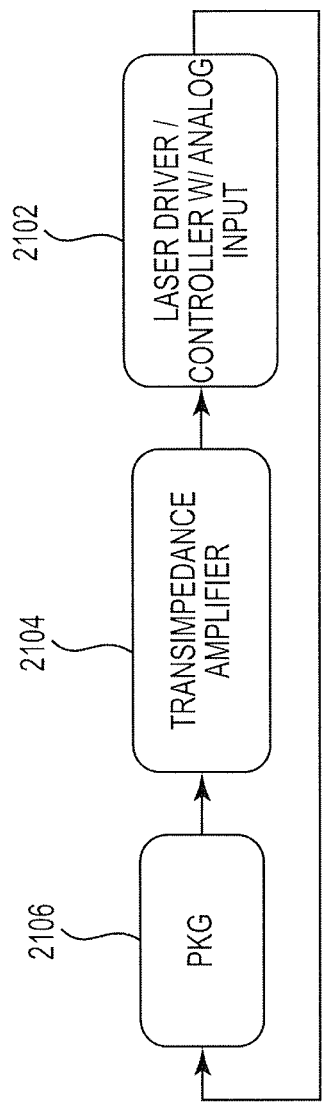
FIG. 21A is a process flow of a method where some of the analog electronics of FIGS. 20A and B have been replaced by a laser driver and controller, according to one or more embodiments.
Figure 21B:
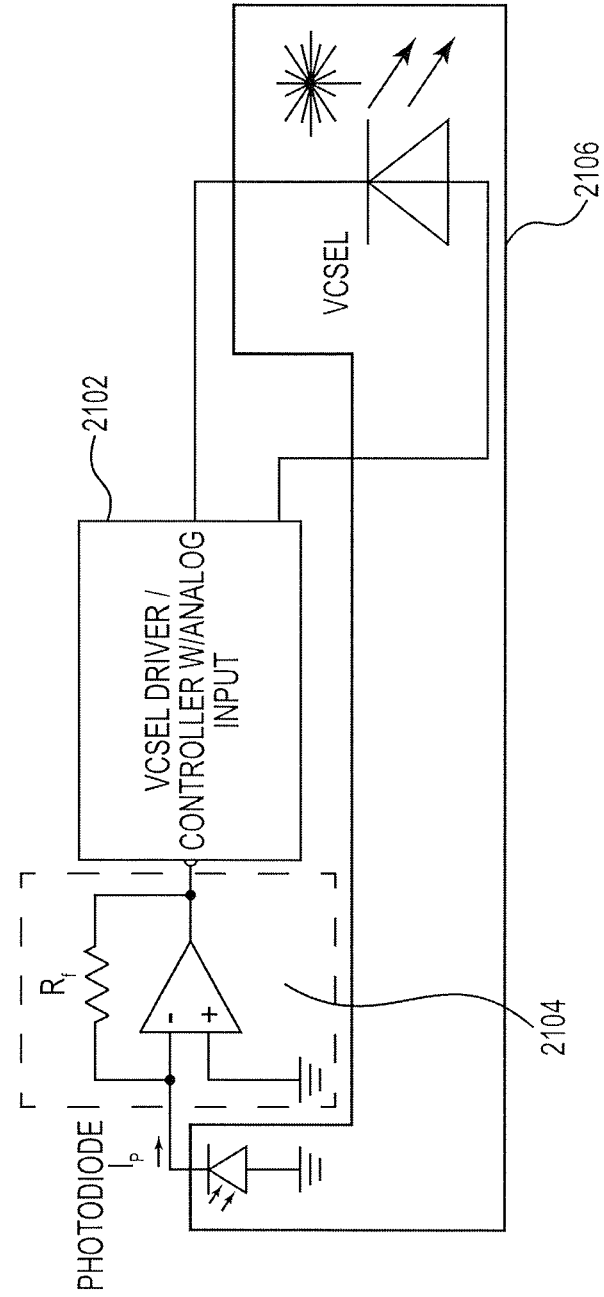
FIG. 21B is a schematic circuit according to the process flow of FIG. 19A, according to one or more embodiments.

In one or more embodiments, a driver may be utilized to control the energizing of an optical element such as a laser. FIG. 21A shows a concept where some of the analog electronics as shown, for example, in FIG. 20B, have been replaced by a laser driver and controller 2102 that uses an analog input to determine the current of the photodiode. In the illustrated embodiment, a controller or a separate microcontroller of controller 2102 may be used to evaluate the signal received from a transimpedance amplifier 2104 to determine control of the laser 2106. FIG. 21B illustrates a circuit diagram of the process flow shown in FIG. 21A. As shown in FIG. 21B, amplifier 2104 may deliver a signal to laser driver and controller 2102, which may interface with laser 2106 via a differential drive. Other methods to utilize and control laser driver and controller 2102 using alternative electronics, hardware, firmware, or software, as would be clear to others practiced in the art.

Figure 22A:
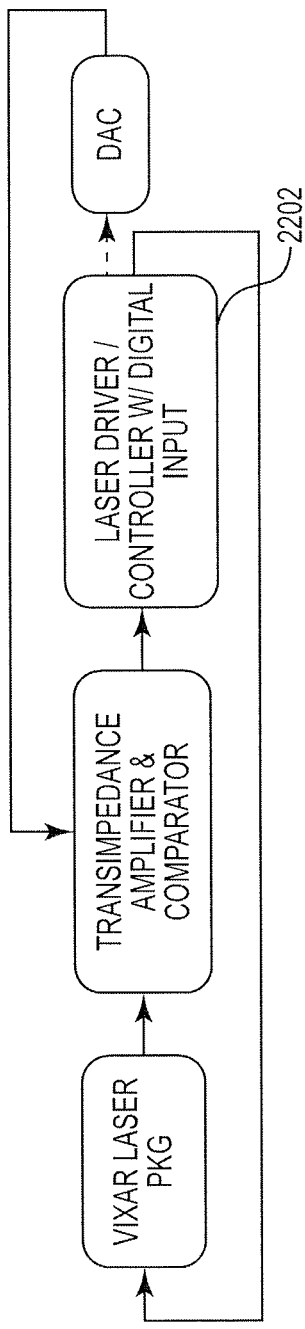
FIG. 22A is a process flow of a method for a concept using a control unit or other software driven solution to generate a signal from a digital to analog converter to automatically set reference voltages, according to one or more embodiments.
Figure 22B:
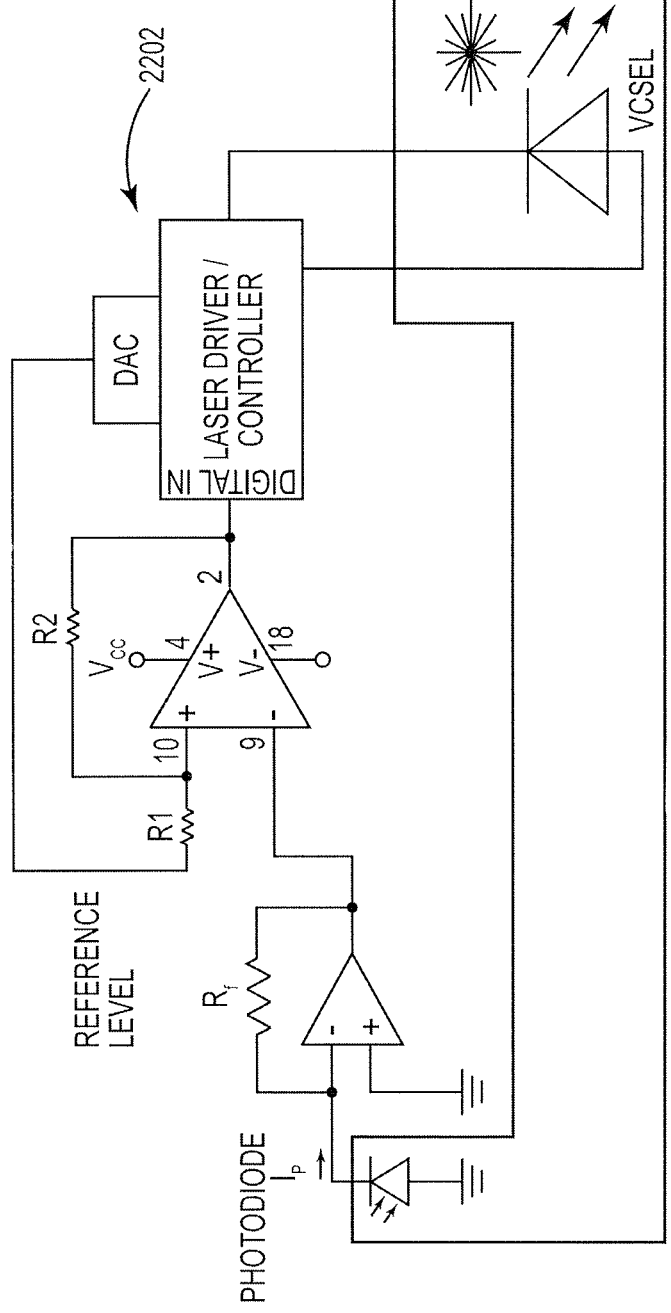
FIG. 22B is a schematic circuit according to the process flow of FIG. 22A, according to one or more embodiments.

FIG. 22A shows another embodiment in which either the driver/controller 2202 or a separate electronic element, such as a microcontroller, DSP, FPGA, integrated logic or circuit, or other software driven solution generates the signal from a digital to analog converter (DAC) 2204 and automatically sets an expected reference signal. According to some embodiments, controller 2202 or a similar electrical device may also make use of a digital input line to determine error conditions according to the comparator. FIG. 22B illustrates a circuit diagram of the process flow shown in FIG. 22A. Variations and combinations of the various solutions presented will be understood by those of skill in the art, and are contemplated by the present disclosure.

Figure 23:
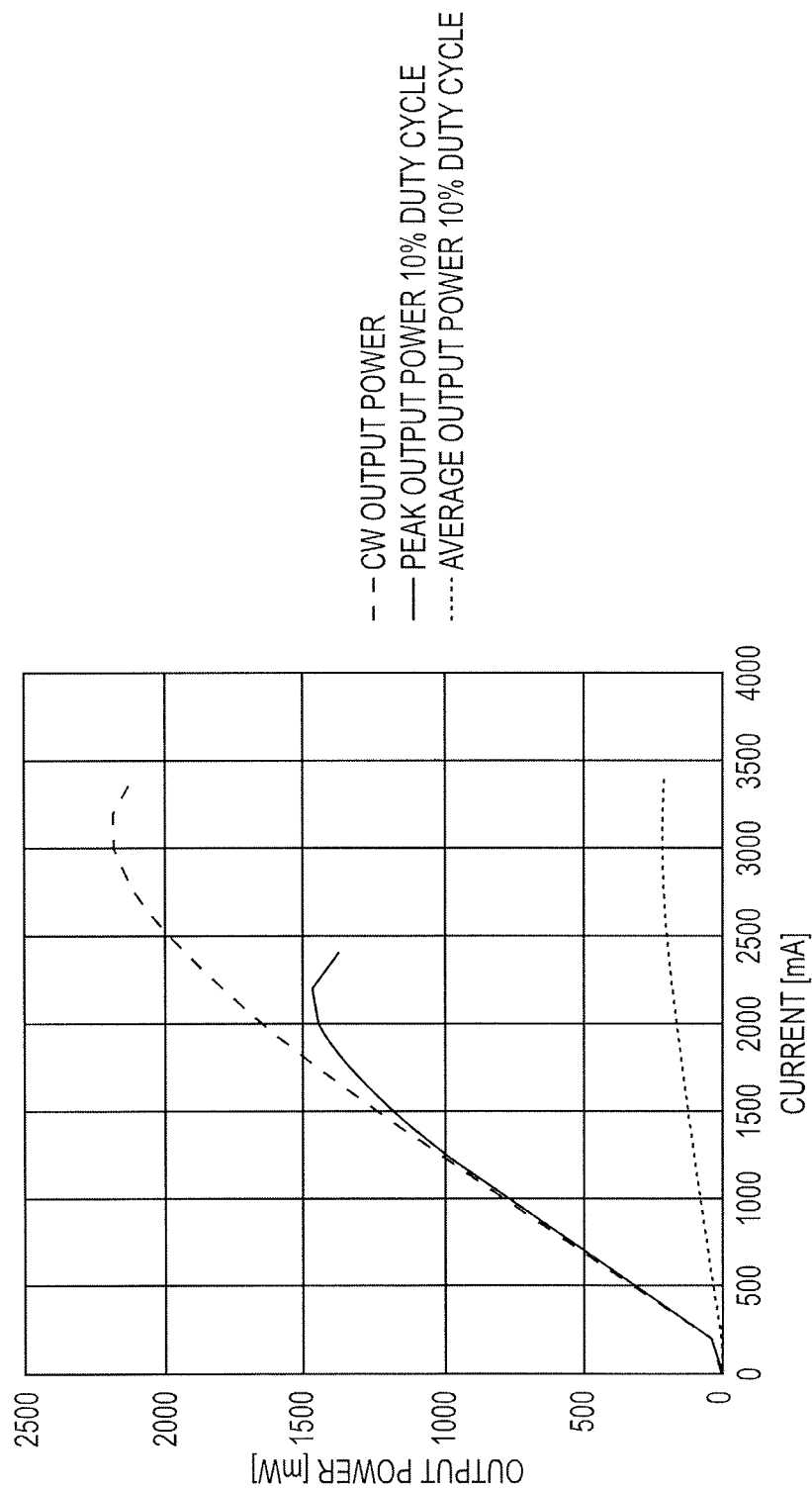
FIG. 23 is a graph illustrating output power of a VCSEL against current of the VCSEL, according to one or more embodiments.

Another potential failure mechanism by which eye safe levels can be exceeded, is if the driver circuit should fail, resulting in the VCSEL being operated continuously instead of pulsed. FIG. 23 illustrates how the output power may vary in these two different conditions. The output power versus current is plotted for these cases. The higher output power curve shows the peak power (not averaged) when a VCSEL array is pulsed with a 10% duty cycle. The average power may therefore be 10× lower, and is plotted in the lowest curve. The intermediate curve shows the output power of the VCSEL when the VCSEL die is operated continuously. Due to internal self-heating, at some point the output power of the VCSEL array begins to roll off with increasing current. In the example of FIG. 23, this begins to happen at around 1250 mA of current and 1 W output power. At slightly more than 2000 mA, the output power stops increasing and actually decreases with increasing current. One may again set a threshold for output current from the photodiode to detect this fault. If the subsequent circuits are detecting peak current, then the threshold can be placed at a photodiode current corresponding to a peak output power slightly above 1600 mW. If the subsequent circuit is measuring the average output power, then the threshold can be placed at an photodiode current corresponding to an output power between 300 mW and 1500 mW.

Figure 24:
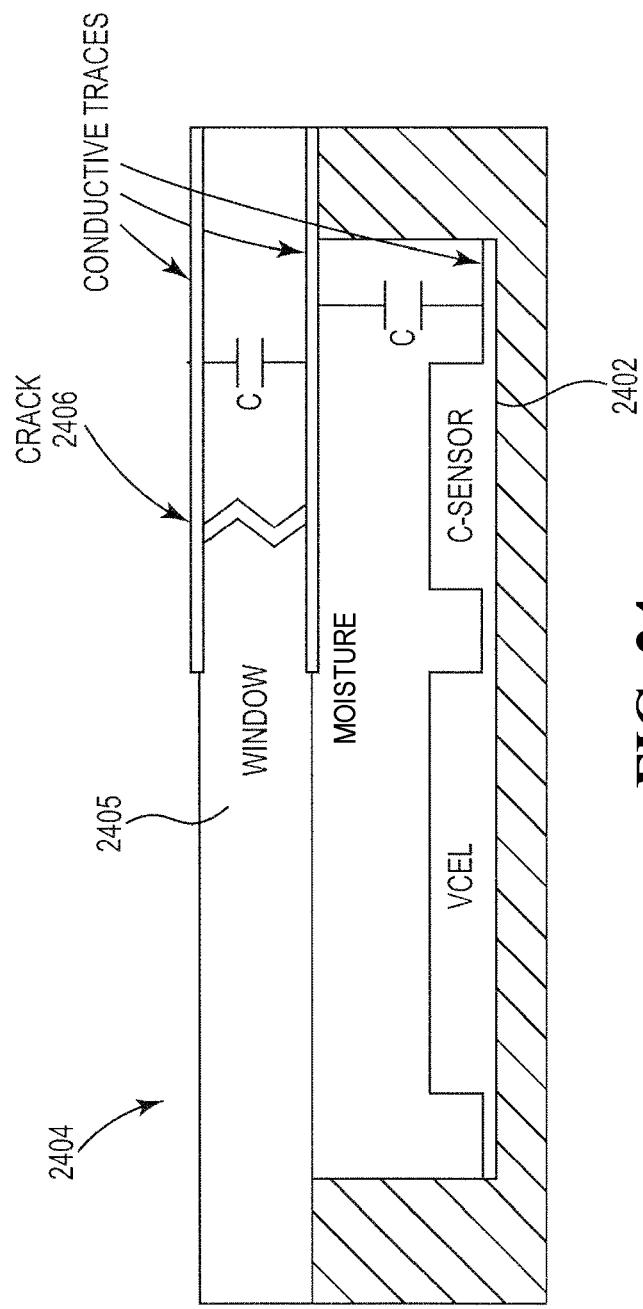
FIG. 24 is a schematic cross sectional view of a VCSEL package including a capacitive sensor, according to one or more embodiments.

Another means of detecting the loss of the diffuser or window, a crack in said diffuser or window, melting of said diffuser or window, or the presence of liquid on said diffuser or window, or any circumstance that may compromise the eye safe operation of the VCSEL device, would be to incorporate a capacitive sensor 2402 into a VCSEL package 2404 as shown in FIG. 24. Capacitive sensor 2402 may be used as proximity sensors, and are very sensitive to the package environment and mechanical state of the package, and specifically to changes in the state thereof. In one embodiment, the sensor may include a detection circuit and a transducer. The detection circuit could be a discrete circuit in the package, a discrete circuit outside the package, or functionally integrated into the VCSEL driver. While not the only detection mechanism for a capacitive sensor, it is common to place a capacitive transducer electrically in the resonant circuit of an oscillator followed by a frequency-to-voltage converter circuit. Changes to the package state, such as due to the loss of an affixed diffuser or window 2405, a crack 2406 in said diffuser or window 2405, or moisture on said diffuser or window 2405, may cause a change in capacitance which could then be detected as a change in the voltage of the detection circuit, causing, for example, a "laser disable" event signal to be raised. The transduction mechanism could be via a discrete capacitive sensor inside the laser package, or rely on mutual or self capacitance of or between the package components, i.e., the window itself, or the window in concert with the package housing. The capacitive change could be due to a proximity effect involving the diffuser or window, or moisture thereon. The window, diffuser, or package may have additional conductive coatings such as metallizations or indium tin oxide layers to facilitate the capacitive transduction, or be purely a proximity effect.

Figure 25:
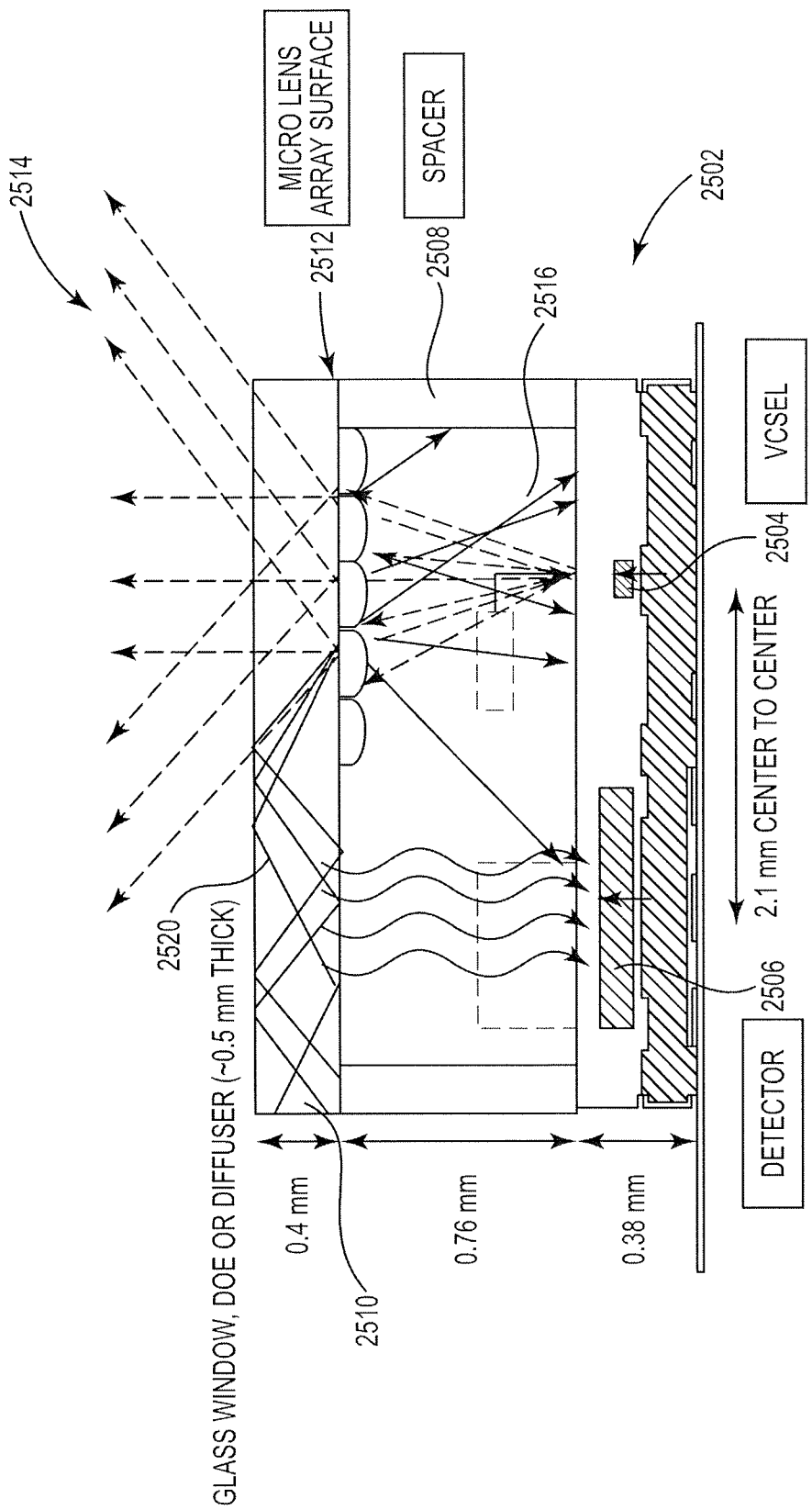
FIG. 25 is a schematic cross-sectional view of a VCSEL package including a micro lens array, according to one or more embodiments.

FIG. 25 is a schematic cross-sectional view of a VCSEL package including a micro lens array, according to one or more embodiments. Similarly to the embodiments shown in FIGS. 11, 12, and 15, the illustrated embodiments relates to a VCSEL package 2502 that may include a VCSEL 2504, photodetector 2506, spacer 2508, window 2510, and one or more micro lenses 2512. VCSEL 2504 may include a single or multiple VCSEL devices in an array, or alternatively another optical element. As shown in FIG. 25, in some embodiments, one or more micro lenses 2512 may be arranged on at least a portion of the window 2510 such that the light from the VCSEL device 2504 impinges upon the one or more micro lenses 2512. The one or more micro lenses 25125 may be arranged in a random or regular array. In some embodiments, the one or more micro lenses may be arranged such that a portion of the light emitted from the VCSEL device is transferred through the micro lens, and a portion of the light is scattered laterally, thereby increasing the eye safety of the device. A micro lens or micro lens array 2512 may further be disposed in any location such that lenses 2512 impinge on the light from the VCSEL 2504.

In place of allowing the diffuser in a package to scatter the light laterally, one can also use a multiple lens array 2512. In this case the lens 2512 is also on the inside surface of the package. In some embodiments the lens array may not have a 1:1 relationship to the VCSEL array 2504 so as to improve light scatter. The light from the VCSEL array 2504 may impinge upon the individual lenses in the array 2512, with the light from one VCSEL 2504 typically impinging upon more than one lens 2512. As with the diffuser, most of the light is transferred through the diffuser to illuminate a field of view, as shown with arrows 2514. However, a fraction of the light (in the range from 1% to 20%) is scattered back into the package, as shown at 2516. Because light hits the lenses at a range of angles with respect to the lens surface, the light is scattered into a wide range of angles, and hence is transmitted at a higher angle laterally than would be achieved with a flat window surface. The solid arrows 2516 show the scattering of the light. In some embodiments, light may be reflected from the surface of the lenses 2512 at a wide range of angles, due to the fact that VCSEL 2504 light will hit the various lenses 2512 at a wide range of angles. Other light may also be scattered into the lens glass layer at window 2510 and may be laterally scattered (as shown at 2520), and then scattered again down toward the photodetector 2506. As with a diffuser embodiment, a higher percentage of the light will reach the photodetector which is located beside the VCSEL array 2504 than would be achieved if relying solely on reflection from a flat glass surface. In some embodiments, a diffuser may be used in conjunction with a window 2510 and/or diffuser (not shown).

As used herein, the terms "substantially" or "generally" refer to the complete or nearly complete extent or degree of an action, characteristic, property, state, structure, item, or result. For example, an object that is "substantially" or "generally" enclosed would mean that the object is either completely enclosed or nearly completely enclosed. The exact allowable degree of deviation from absolute completeness may in some cases depend on the specific context. However, generally speaking, the nearness of completion will be so as to have generally the same overall result as if absolute and total completion were obtained. The use of "substantially" or "generally" is equally applicable when used in a negative connotation to refer to the complete or near complete lack of an action, characteristic, property, state, structure, item, or result. For example, an element, combination, embodiment, or composition that is "substantially free of" or "generally free of" an element may still actually contain such element as long as there is generally no significant effect thereof.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

Additionally, as used herein, the phrase "at least one of [X] and [Y]," where X and Y are different components that may be included in an embodiment of the present disclosure, means that the embodiment could include component X without component Y, the embodiment could include the component Y without component X, or the embodiment could include both components X and Y. Similarly, when used with respect to three or more components, such as "at least one of [X], [Y], and [Z]," the phrase means that the embodiment could include any one of the three or more components, any combination or sub-combination of any of the components, or all of the components.

In the foregoing description various embodiments of the present disclosure have been presented for the purpose of illustration and description. They are not intended to be exhaustive or to limit the invention to the precise form disclosed. Obvious modifications or variations are possible in light of the above teachings. The various embodiments were chosen and described to provide the best illustration of the principals of the disclosure and their practical application, and to enable one of ordinary skill in the art to utilize the various embodiments with various modifications as are suited to the particular use contemplated. All such modifications and variations are within the scope of the present disclosure as determined by the appended claims when interpreted in accordance with the breadth they are fairly, legally, and equitably entitled.

What is claimed is:

1. An optical element package, comprising:
   at least one optical element arranged on a submount;
   a window configured and arranged to allow light emitted from the optical element to pass through the window;
   a plurality of micro lenses arranged on at least a portion of the window such that the light from the optical element contacts the plurality of micro lenses; and
   a photodiode arranged on the submount beside the at least one optical element and offset from the plurality of micro lenses;
   wherein a first portion of the light is transferred through the plurality of micro lenses, a second portion of the light is scattered back into the package, and a third portion of light is scattered laterally in the window and down towards the photodiode;
   wherein a number of micro lenses in the optical element package exceeds a number of optical elements in the optical element package.

2. The optical element package of claim 1, wherein the optical element comprises one or more VCSEL devices.

3. The optical element package of claim 1, wherein the plurality of micro lenses are arranged in an irregular pattern.

4. The optical element package of claim 1, wherein the plurality of micro lenses are arranged in a regular array pattern.

5. The optical element package of claim 1, wherein the one or more micro lenses are positioned such that the majority of light from the optical element passes through the window.

6. The optical element package of claim 1, further comprising a spacer arranged between the submount and the window.

7. The optical element package of claim 1, wherein at least 20% of the light emitting from the optical element scatters back into the optical element package.

8. The optical element package of claim 1, wherein the one or more micro lenses are arranged on the window so as to be aligned with a central axis of light emitted from the VCSEL device.

9. The optical element package of claim 1, wherein a portion of the light emitted is scattered laterally, thereby increasing the eye safety of the device.

* * * * *